US012757447B2

(12) United States Patent
Hsu et al.

(10) Patent No.: US 12,757,447 B2
(45) Date of Patent: Oct. 6, 2026

(54) HIGH ELECTRON MOBILITY TRANSISTOR WITH HELPING GATE

(71) Applicant: Taiwan Semiconductor Manufacturing Company, Ltd., Hsinchu (TW)

(72) Inventors: Chiao-Chun Hsu, Hsinchu City (TW); Chu Fu Chen, Zhubei City (TW); Ting-Yu Chen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 457 days.

(21) Appl. No.: 18/351,761

(22) Filed: Jul. 13, 2023

(65) Prior Publication Data

US 2025/0022932 A1 Jan. 16, 2025

(51) Int. Cl.

| | |
|---|---|
| ***H10D 30/67*** | (2025.01) |
| ***H10D 30/01*** | (2025.01) |
| ***H10D 30/47*** | (2025.01) |
| ***H10D 62/10*** | (2025.01) |
| ***H10D 62/85*** | (2025.01) |
| ***H10D 64/01*** | (2025.01) |
| ***H10D 64/64*** | (2025.01) |

(52) U.S. Cl.

CPC ......... *H10D 30/675* (2025.01); *H10D 30/015* (2025.01); *H10D 30/475* (2025.01); *H10D 30/6738* (2025.01); *H10D 62/106* (2025.01); *H10D 62/85* (2025.01); *H10D 62/8503* (2025.01); *H10D 64/01* (2025.01); *H10D 64/64* (2025.01)

(58) Field of Classification Search

CPC ........................... H10D 30/015; H10D 30/471

See application file for complete search history.

(56) References Cited

U.S. PATENT DOCUMENTS

2016/0043208 A1* 2/2016 Ikoshi .................. H10D 30/475 257/192

2024/0030217 A1* 1/2024 Prechtl ..................... H10D 8/60

* cited by examiner

*Primary Examiner* — William B Partridge
*Assistant Examiner* — Alexander X Ramirez
(74) *Attorney, Agent, or Firm* — Eschweiler & Potashnik, LLC

(57) ABSTRACT

Some embodiments relate to an integrated device, including a semiconductor film accommodating a two-dimensional carrier gas (2DCG) over a substrate; a first source/drain electrode over the semiconductor film; a second source/drain electrode over the semiconductor film; a semiconductor capping structure between the first source/drain electrode and the second source/drain electrode; a first gate overlying the semiconductor capping structure and between the first source/drain electrode and the second source/drain electrode in a first direction; a first helping gate overlying the semiconductor capping structure and bordering the first gate, wherein the first helping gate and the second source/drain electrode are arranged in a line extending in a second direction transverse to the first direction.

20 Claims, 15 Drawing Sheets existing method 1 existing method 2 existing method 3 inventive method real image existing method 1 existing method 2 existing method 3 inventive method real image

HIGH ELECTRON MOBILITY TRANSISTOR WITH HELPING GATE

BACKGROUND

High-electron-mobility transistors (HEMTs) are a type of field-effect transistor. Whereas a traditional n-type MOSFET includes a gate electrode arranged over a p-type doped channel region that separates n-type source/drain electrodes, for example, a HEMT device uses a heterojunction as the channel instead of a doped region. This heterojunction is defined by an interface at which two materials with different band gaps meet one another. III-N (tri nitride) devices are one type of HEMT where the heterojunction is made up of a Group-III material (e.g., Al, Ga, In) and a nitride (N) material. These III-N devices show very promising performance in high-power and high-frequency applications. III-N devices can be used, for example, in high power-high frequency applications such as emitters for cell phone base stations, Direct Broadcast Satellite (DBS) receivers, electronic warfare systems, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
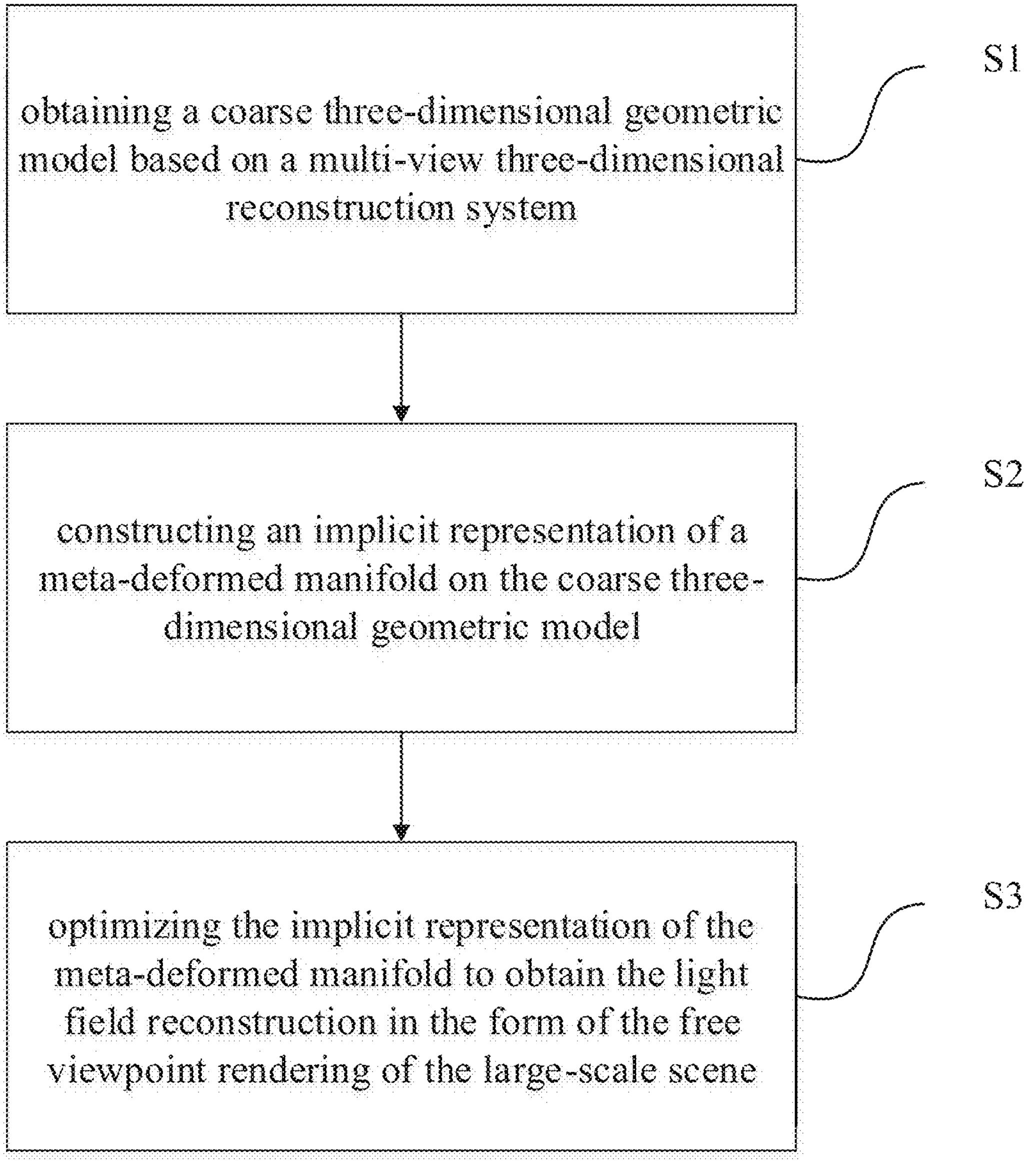
FIGS. 1A-1C illustrate a top view and cross-sectional views of some embodiments of a pair of HEMT with helping gates.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high electron mobility transistor (HEMT) may comprise a heterojunction structure, as well as a pair of source/drain electrodes, a gate, and a semiconductor capping structure. The heterojunction structure comprises a channel layer and a barrier layer directly contacting at a heterojunction. The channel layer accommodates a two-dimensional electron gas (2DEG) extending along the heterojunction and forms a channel of the HEMT, whereas the barrier induces formation of the 2DEG. The pair of source/drain electrodes and the gate overlie the heterojunction structure with the gate between the pair of source/drain electrodes. The semiconductor capping structure separates the gate from the heterojunction structure and induces formation of a depletion region in the 2DEG directly beneath the semiconductor capping structure in the absence of an external electric field (e.g., from the gate).

During operation of the HEMT, the gate is selectively biased to change the HEMT between an ON state and an OFF state. In the ON state, the gate is biased with a first voltage that exceeds a threshold voltage. As a result, an electric field produced by the gate enhances the 2DEG beneath the gate to remove the depletion region and to extend the 2DEG continuously between the source/drain electrodes. In the OFF state, the gate is biased with a second voltage that is less than the threshold voltage. As a result, the depletion region persists and the 2DEG is discontinuous between the source/drain electrodes.

A challenge with the HEMT is that electrons may become trapped in the semiconductor capping structure and the heterojunction structure, resulting in variation of the threshold voltage when switching between states and an increase in ON resistance of the HEMT. The increase in ON resistance increases heat generated during operation, potentially leading to a more rapid degradation of the HEMT. The variation in the threshold voltage results in a greater difference between the first voltage and the second voltage for reliable operation, thereby leading to a loss of power efficiency. Increasing gate leakage may inject holes to release the trapped electrons. However, this would lower the threshold voltage, which may increase source/drain leakage in the OFF state and reduce power efficiency. Therefore, increasing gate leakage without reducing the threshold voltage may be desirable.

The present disclosure provides a HEMT with a helping gate outside an active region of the HEMT. The helping gate directly contacts the semiconductor capping structure and has a work function that is lower than a work function of the gate. By arranging the helping gate outside the active region, the helping gate does not directly alter the threshold voltage of the HEMT. By lowering the work function of the helping gate, and by arranging the helping gate in direct contact with the semiconductor capping structure without an intervening gate dielectric, the helping gate has a higher gate leakage than the gate. The higher gate leakage injects holes into the semiconductor capping structure and the heterojunction structure, releasing trapped electrons. By releasing trapped electrons, ON resistance is reduced and variation of the threshold voltage is reduced. Further, the helping gate may be formed simultaneously with the source/drain electrodes, resulting in no extra steps in the formation process.

FIGS. 1A, 1B, and 1C illustrate a top view 100*a* and cross-sectional views 100*b*, 100*c* of some embodiments of a pair of HEMTs with helping gates. The cross-sectional view 100*b* of FIG. 1B may, for example, be taken along line A-A' in FIG. 1A. The cross-sectional view 100*c* of FIG. 1C may, for example, be taken along line B-B' in FIG. 1A.

As shown in the top view 100*a* of FIG. 1A, a first source/drain electrode 116*a*, a second source/drain electrode 116*b*, and a third source/drain electrode 116*c* are on an active region 103 that is surrounded by and demarcated by an isolation structure 105. In some embodiments, the first source/drain electrode 116*a* and the third source/drain electrode 116*c* are drain electrodes and the second source/drain electrode 116*b* is a source electrode, or vice versa. The second source/drain electrode 116*b* is between the first source/drain electrode 116*a* and the third source/drain electrode 116*c*. Further, the first source/drain electrode 116*a* is separated from the second source/drain electrode 116*b* by a first gate 112*a*, and the third source/drain electrode 116*c* is separated from the second source/drain electrode 116*b* by a second gate 112*b*. That is, the first gate 112*a* is between the first source/drain electrode 116*a* and the second source/drain electrode 116*b* in a first direction 111.

The first gate 112*a* and the second gate 112*b* extend past opposite sides of the active region 103 to overlap with the isolation structure 105 on the opposite sides. Further, the first gate 112*a* and the second gate 112*b* are both surrounded by a gate dielectric 114. In alternative embodiments, the gate dielectric 114 is omitted. The gate dielectric 114 spaces the first gate 112*a* and the second gate 112*b* from a semiconductor capping structure 110.

The first source/drain electrode 116*a*, the first gate 112*a*, and the second source/drain electrode 116*b* collectively form a first HEMT 130, and the second source/drain electrode 116*b*, the second gate 112*b*, and the third source/drain electrode 116*c* collectively form a second HEMT 132. The first and second HEMTs 130, 132 may, for example, be enhancement mode HEMTs and/or may, for example, gallium nitride (GaN) HEMTs. In alternative embodiments, the first and second HEMTs are some other suitable type of HEMTs.

The semiconductor capping structure 110 is between the gate dielectric 114 and the active region 103 (as better seen in FIG. 1B). Further, the semiconductor capping structure 110 has a ring-shaped layout surrounding the second source/drain electrode 116*b*, between the first source/drain electrode 116*a* and the third source/drain electrode 116*c*. In alternative embodiments, the semiconductor capping structure 110 has some other suitable layout. The semiconductor capping structure 110 extends past the opposite sides of the active region 103 and overlaps with the isolation structure 105 on the opposite sides.

A first helping gate 124*a* is disposed directly on a first portion 125*a* of the semiconductor capping structure 110 overlapping with the isolation structure 105. A second helping gate 124*b* is disposed directly on a second portion 125*b* of the semiconductor capping structure 110 overlapping with the isolation structure 105. In some embodiments, the first helping gate 124*a* and the second helping gate 124*b* form Schottky barriers with the semiconductor capping structure 110. The first portion 125*a* and the second portion 125*b* are on opposite sides of the semiconductor capping structure 110. The first helping gate 124*a* and the second helping gate 124*b* have individual work functions that are different than individual work functions of the first gate 112*a* and the second gate 112*b*. The first helping gate 124*a*, the second helping gate 124*b*, and the second source/drain electrode 116*b* are arranged in a line extending in a second direction 113 transverse to the first direction 111.

The direct contact between the first helping gate 124*a* and the semiconductor capping structure 110, and/or the work function of the first helping gate 124*a*, contribute to the first helping gate 124*a* having a higher leakage current than the first gate 112*a*. The higher leakage current injects holes into the semiconductor capping structure 110 and/or the active region 103, resulting in trapped electrons in the semiconductor capping structure 110 and the active region 103 being released. The trapped electrons increase threshold-voltage variation and ON resistance of the first HEMT 130, whereby releasing the trapped electrons leads to decreased threshold-voltage variation and decreased ON resistance. The decreased threshold-voltage variation leads to increased power efficiency, and the decreased ON resistance leads to less degradation and higher reliability. Further, the same benefits similarly accrue to the second HEMT 132 through use of the second helping gate 124*b* to inject holes.

As shown in the cross-sectional view 100*b* of FIG. 1B, a channel layer 104 and a barrier layer 106 overly the substrate 102 and define the active region 103. The channel layer 104 has a different bandgap than the barrier layer 106 and underlies and directly contacts the barrier layer 106 at a heterojunction. Hence, the channel layer 104 and the barrier layer 106 form a heterojunction structure (e.g., a group III-V heterojunction structure or the like). Further, the channel layer 104 accommodates a channel 108. The channel 108 extends along the heterojunction and has a high concentration of mobile electrons, whereby the channel 108 may, for example, be a 2DEG. Because of the high concentration, the channel 108 is conductive. In some embodiments, the channel layer 104 and the barrier layer 106 may be referenced together as a heterojunction, a semiconductor film, or the like.

The barrier layer 106 is polarized so the channel 108 forms in the channel layer 104. For example, the barrier layer 106 may be polarized so positive charge is shifted towards a bottom surface of the barrier layer 106, and negative charge is shifted towards a top surface of the barrier layer 106, to form the channel 108 as a 2DEG. The polarization may, for example, result from spontaneous and/or piezoelectric polarization effects.

The gate dielectric 114 spaces bottom surfaces of the first gate 112*a* and the second gate 112*b* from a top surface of the semiconductor capping structure 110. Similar to the barrier layer 106, the semiconductor capping structure 110 is polarized so as to deplete the channel 108 directly under the semiconductor capping structure 110 in the absence of an external electric field. As such, the depletion region 109 forms in the absence of an electric field from the first gate 112*a* and the second gate 112*b*. Further, the semiconductor capping structure 110 has a bandgap unequal to a bandgap of the barrier layer 106.

During operation, one of the first gate 112*a* or the second gate 112*b* is selectively biased to generate an electric field that manipulates the continuity of the channel 108 between the first source/drain electrode 116*a*, the second source/drain electrode 116*b*, and the third source/drain electrode 116*c*. For example, when the first gate 112*a* is biased with a voltage that is more than a threshold voltage, the first gate 112*a* may attract electrons to enhance the channel 108 at the first gate 112*a* and to remove the depletion region 109 at the first gate 112*a*. As a result, the channel 108 may be continuous from the first source/drain electrode 116*a* to the second source/drain electrode 116*b*. In a similar fashion, when the second gate 112*b* is biased with a voltage that is more than a threshold voltage, the channel 108 may be continuous from the second source/drain electrode 116*b* to the third source/drain electrode 116*c*.

In some embodiments, the first source/drain electrode 116*a*, the second source/drain electrode 116*b*, and the third source/drain electrode 116*c* extend to the channel layer 104. In other embodiments, the first source/drain electrode 116*a*, the second source/drain electrode 116*b*, and the third source/drain electrode 116*c* are separated from the channel layer 104 by the barrier layer 106. Further, in some embodiments, the first source/drain electrode 116*a*, the second source/drain electrode 116*b*, and the third source/drain electrode 116*c* are Ohmically coupled to the channel 108.

Contacts 120 couple the first source/drain electrode 116*a*, the second source/drain electrode 116*b*, the third source/drain electrode 116*c*, the first gate 112*a*, and the second gate 112*b* to an interconnect structure 126. The contacts 120 are surrounded by a second dielectric 122 overlying a first dielectric 118. The first dielectric 118 surrounds outer sidewalls of the first source/drain electrode 116*a*, the second source/drain electrode 116*b*, the third source/drain electrode 116*c*, the gate dielectric 114, and the semiconductor capping structure 110. A third dielectric 128 surrounds the interconnect structure 126. In some embodiments, the interconnect structure 126 couples the first gate 112*a* to the first helping gate 124*a*.

As shown in the cross-sectional view 110*c* of FIG. 1C, the first helping gate 124*a* and the second helping gate 124*b* are arranged in a line with the second source/drain electrode 116*b*. The channel 108 extends beneath the second source/drain electrode 116*b*, but does not extend outside of the active region 103 to the first helping gate 124*a* or the second helping gate 124*b*. The first helping gate 124*a* and the second helping gate 124*b* overly the isolation structure 105, and are separated from the isolation structure 105 by the semiconductor capping structure 110. The contacts 120 also couple the first helping gate 124*a* and the second helping gate 124*b* to the interconnect structure 126.

In some embodiments, the first helping gate 124*a* is electrically coupled to the first gate 112*a*. As such, the voltage used to bias the first gate 112*a* also biases the first helping gate 124*a*. As the channel 108 does not extend beneath the first helping gate 124*a* or the second helping gate 124*b*, biasing the first helping gate 124*a* does not directly alter the continuity of the channel 108. Instead, biasing the first helping gate 124*a* induces a leakage current that injects holes into the semiconductor capping structure 110, the barrier layer 106, and the channel layer 104. The injected holes release trapped electrons, which otherwise would increase the ON resistance (e.g., $R_{ds}$(ON)) of the channel 108 and threshold-voltage variation.

Figure 2A:
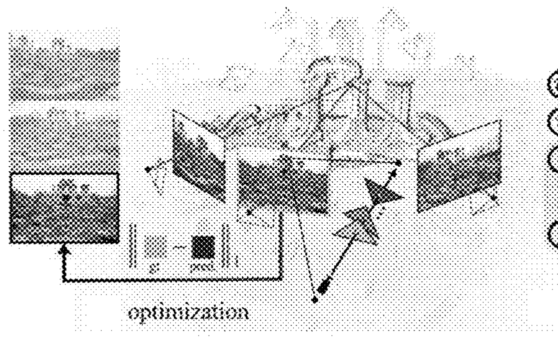
FIG. 2A illustrates a top view of the pair of HEMT of FIGS. 1A-1C during operation.

FIG. 2A illustrates a top view 200*a* of the pair of HEMTs of FIGS. 1A-1C during operation of the pair of HEMTs. Note that the first gate 112*a* and the second gate 112*b* are shown in phantom for ease of viewing.

During operation, electrons 204 may become trapped in the channel layer (see 104 of FIG. 1B), the barrier layer 106, and the semiconductor capping structure 110. Traps may be located at grain boundaries and defects in the channel layer 104, the barrier layer 106, and the semiconductor capping structure 110. Further, the traps may have energy levels between the conduction band and the valence band of the materials at which the traps are located (e.g., materials of the barrier layer 106 et al.). This results in electrons 204 in the channel (see 108 of FIG. 1B) entering the traps from the conduction band and being immobile until they acquire enough energy to re-enter the conduction band or combine with holes 202.

The first helping gate 124*a* and the second helping gate 124*b* are configured to have a higher leakage current than the first gate 112*a* and the second gate 112*b*, resulting in the first helping gate 124*a* and the second helping gate 124*b* injecting holes 202 into the channel layer 104, the barrier layer 106, and the semiconductor capping structure 110. In some embodiments, the leakage current of the first helping gate 124*a* and the second helping gate 124*b* may be 60% higher than the leakage current of the first gate 112*a* and the second gate 112*b*. That is, the ratio of the leakage current of the first helping gate 124*a* to the leakage current of the first gate 112*a* may be approximately 1.6. The holes 202 combine with the trapped electrons 204 and release the trapped electrons 204 from the traps.

Trapped electrons result in an increase in the ON resistance $R_{ds}$(ON) of the channel during operation, leading to an increase in heat generation and further degradation of the HEMT. The trapped electrons further contribute to differences in the threshold voltage between turning the device from an OFF state to an ON state and turning the device from an ON state to an OFF state. The gate leakage current from the first and second helping gates 124*a*. 124*b* mitigates these issues by combining holes 202 from the gate leakage current with the electrons 204 that are trapped, thereby removing trapped electrons 204 from the traps during operation.

In some embodiments, the first gate 112*a* and the first helping gate 124*a* are coupled to a first wire 206 in the interconnect structure 126. As such, the first gate 112*a* and the first helping gate 124*a* share a bias voltage V1. Further, the first helping gate 124*a* injects holes while the first HEMT 130 is in an ON state. Similarly, the second gate 112*b* and the second helping gate 124*b* are coupled to a second wire 208 in the interconnect structure 126. As such, the second gate 112*b* and the second helping gate 124*b* share a bias voltage V2. Further, the second helping gate 124*b* injects holes while the second HEMT 132 is in an ON state.

In some embodiments, the semiconductor capping structure 110 is ring shaped and continuously surrounds the second source/drain electrode 116*b*. In other embodiments, to alter the flow of holes 202 into the active region 103, the semiconductor capping structure 110 may be L-shaped or have other suitable shapes.

Figure 2B:
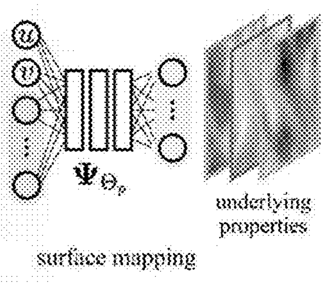
FIG. 2B illustrate a Vg-Id graph for a HEMT of FIGS. 1A-1C.

FIG. 2B illustrates a Vg-Id graph 200*b* for a HEMT of FIGS. 1A-1C. The HEMT may, for example, be the first HEMT 130 of FIGS. 1A-1C or the second HEMT 132 of FIGS. 1A-1C.

As shown in the Vg-Id graph 200*b* of FIG. 2B, the gate voltage is compared to the drain current for the HEMT switching from an OFF state to an ON state (shown as the forward curve 210) and from an ON state to an OFF state (shown as the reverse curve 212). The threshold voltage for switching states in the forward direction (from OFF to ON) may be different from the threshold voltage for switching states in the reverse direction (from ON to OFF) for a plurality of reasons including the number of trapped electrons in the channel. This is seen by the hysteresis effect between the forward curve 210 and the reverse curve 212.

Because the helping gate (e.g., 124*a* or 124*b* of FIG. 2) has high leakage current and injects holes that combine with electrons trapped in the channel (108 of FIG. 1B), the helping gate reduces the amount of hysteresis between the forward curve 210 and the reverse curve 212. Hence, threshold variation is smaller than it would otherwise without including a helping gate.

Figure 2C:
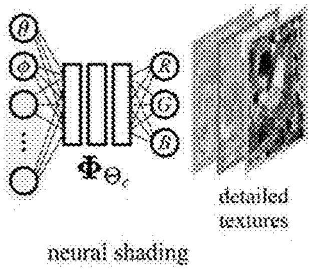
FIG. 2C illustrates band diagrams for a helping gate-semiconductor capping structure interface and a gate-semiconductor capping structure interface.

FIG. 2C illustrates band diagrams for a helping gate-semiconductor capping structure interface and a gate-semiconductor capping structure interface.

As shown in the band diagrams 200*c* of FIG. 2C, a first work function 214 of the first helping gate 124*a* is different from the second work function 218 of the first gate 112*a*. In some embodiments, the first work function 214 is less than the second work function 218. Further, in some embodiments, the semiconductor capping structure 110 has an electron affinity 216 that is closer to the first work function 214 than to the second work function 218. The gate dielectric 114 has a dielectric electron affinity 217 that is less than the electron affinity 216 of the semiconductor capping structure 110.

A difference between the first work function 214 and the electron affinity 216 determines a first barrier 220 of the helping gate-semiconductor capping structure interface. A difference between the second work function 218 and the dielectric electron affinity 217 determines a second barrier 222 of the gate-gate dielectric-semiconductor capping structure interface. The first barrier 220 is less than the second barrier 222, such that the first helping gate 124*a* has a greater amount of leakage current during operation than the first gate 112*a*.

In an alternative embodiment, the gate dielectric 114 is omitted, and both the first barrier 220 and the second barrier 222 are Schottky barriers. When the gate dielectric 114 is omitted, the second barrier 222 is based on a difference between the second work function 218 and the electron affinity 216 of the semiconductor capping structure 110. As the electron affinity 216 is substantially the same in the semiconductor capping structure 110 beneath the first gate 112*a* and beneath the first helping gate 124*a*, a difference between the first barrier 220 and the second barrier 222 is substantially the same as a difference between the first work function 214 and the second work function 218.

Figure 3:
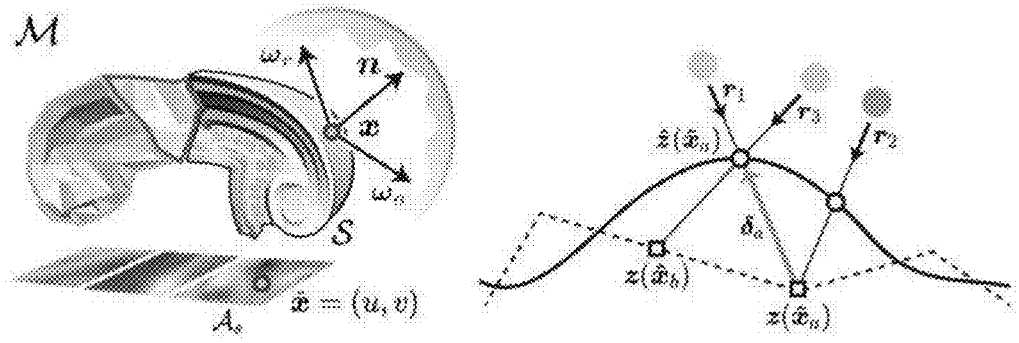
FIGS. 3A-3D illustrate top views and cross-sectional views of some other embodiments of a pair of HEMT with helping gates.
Figure 4:
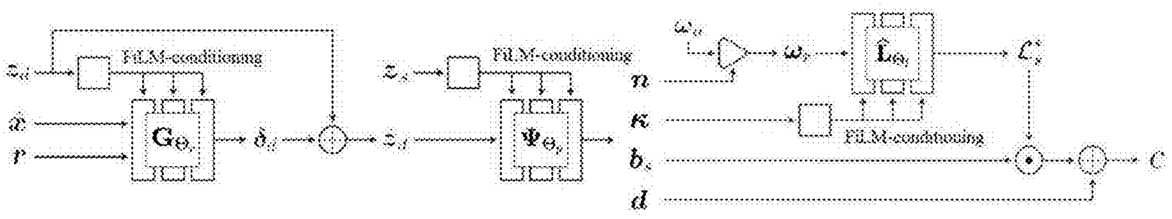
FIGS. 4A-4C to FIGS. 17A-17C illustrate a series of views of some embodiments of a method of forming a pair of HEMT with helping gates.

FIGS. 3A-3C illustrate a top view 300*a* and cross-sectional views 300*b*-300*c* of some other embodiments of a pair of HEMT with helping gates. FIGS. 3A-3C are described concurrently.

In some embodiments, the first source/drain electrode 116*a*, the second source/drain electrode 116*b*, and the third source/drain electrode 116*c* have widths that are greater than a width of the active region 103. That is, the first source/drain electrode 116*a*, the second source/drain electrode 116*b*, and the third source/drain electrode 116*c* extend across the active region 103 and over the isolation structure 105 on opposite sides of the active region 103.

In some embodiments, the gate dielectric (see 114 of FIG. 1B) is omitted, resulting in the first gate 112*a* and the second gate 112*b* directly contacting the semiconductor capping structure 110. The direct contact between the first gate 112*a* and the semiconductor capping structure 110 results in a Schottky barrier forming between the first gate 112*a* and the semiconductor capping structure 110, as described in relation to FIG. 2C.

FIG. 3D illustrates a top view 300*d* of another embodiment of a pair of HEMT with helping gates.

As shown in the top view 300*d* of FIG. 3D, a third helping gate 124*c* is disposed in a third portion 125*c* of the semiconductor capping structure 110 that is directly between the first portion 125*a* and the second portion 125*b*. The second source/drain electrode 116*b* and a third source/drain electrode 116*c* are on either side of the third helping gate 124*c*, between the first gate 112*a* and the second gate 112*b*. The third helping gate 124*c* may distribute the holes (see 202 of FIG. 2A) to a center portion of the first and second HEMTs 130, 132, resulting in a more even distribution of holes (see 202 of FIG. 2A) to further reduce the number of trapped electrons in the devices. In some embodiments, the second source/drain electrode 116*b* and the third source/drain electrode 116*c* are electrically coupled through the interconnect structure (see 126 of FIG. 1B). In some embodiments, the semiconductor capping structure 110 extends through a center of the active region 103 and has an "8" shaped profile when seen from a top view.

With reference to FIGS. 4A-4C to FIGS. 17A-17C, a series of views of some embodiments of a method of forming a pair of HEMT with helping gates is provided. Figures labeled with a suffix of "A" correspond to top views. Figures labeled with a suffix of "B" correspond to cross-sectional views along line A-A' in like numbered figures with a suffix of "A", and Figures labeled with a suffix of "C" correspond to cross-sectional views along line B-B' in like numbered figures with a suffix of "A".

Although FIGS. 4A-4C to FIGS. 17A-17C are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

As shown in a top view 400*a* of FIG. 4A and cross-sectional views 400*b*, 400*c* of FIGS. 4B and 4C, a channel layer 104 and a barrier layer 106 are formed stacked over a substrate 102. The substrate 102 may be any suitable type of substrate and/or may, for example, be a semiconductor wafer, one or more dies on a wafer, or any other suitable type of semiconductor body and/or epitaxial layers. In some embodiments, the substrate 102 is or comprises silicon, sapphire, the like, or any combination of the foregoing.

The channel layer 104 is first deposited over the substrate 102, and then the barrier layer 106 is deposited over the channel layer 104. Such deposition may, for example, be by metal organic chemical vapor deposition (MOCVD) and/or by some other suitable deposition process. The combination of the channel layer 104 and the barrier layer 106 form a heterojunction structure (e.g., group III-V heterojunction structure or the like), and a channel 108 is induced in the channel layer 104 when the barrier layer 106 is deposited. In some embodiments, the channel layer 104 is or comprises a group III-V material, such as gallium nitride (e.g., GaN) or the like. In some embodiments, the barrier layer 106 is or comprises aluminum gallium nitride (e.g., AlGaN) or the like.

Figure 5:
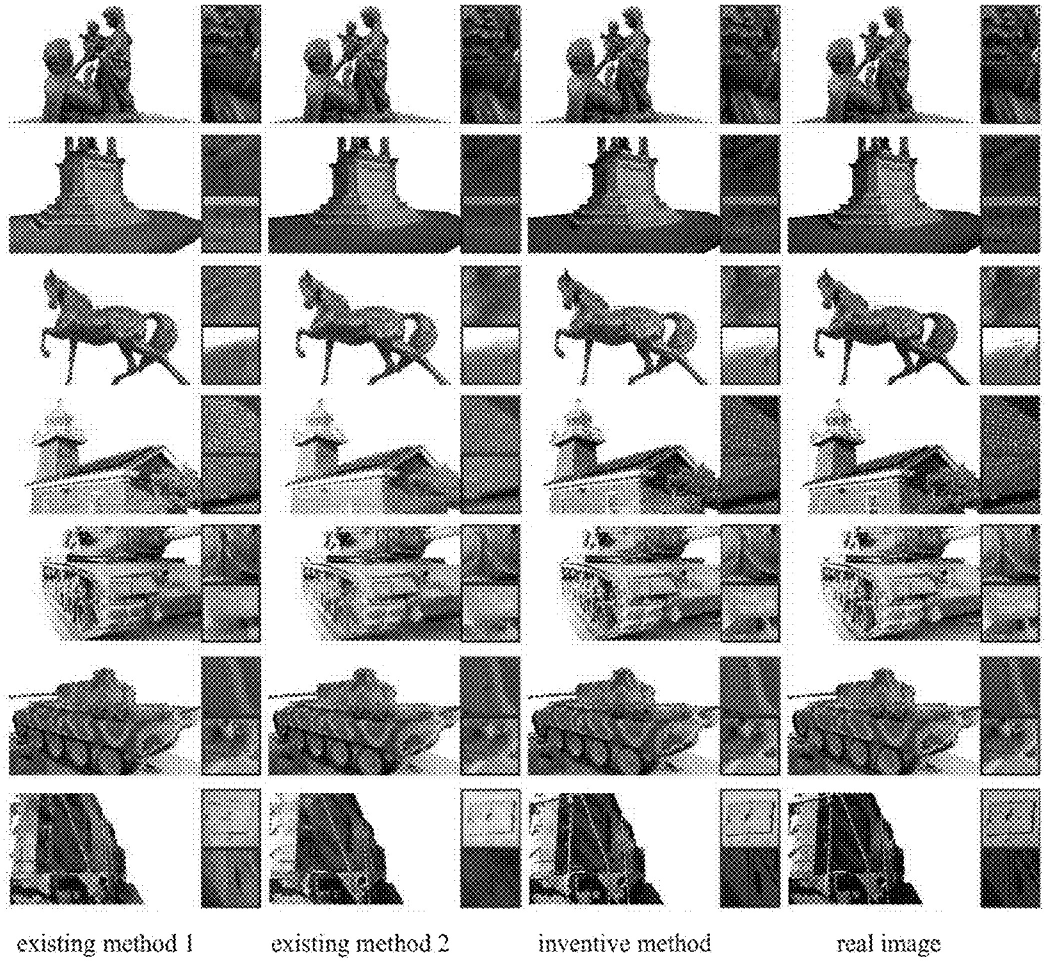

As shown in a top view 500*a* of FIG. 5A and cross-sectional views 500*b*, 500*c* of FIGS. 5B and 5C, a first masking layer 504 is formed over the barrier layer 106. The first masking layer 504 may, for example, be formed using CVD, PVD, ALD, a spin-on process, or the like. The first masking layer 504 is then patterned, thereby exposing portions of the barrier layer 106 corresponding to the location of an isolation structure (see 105 of FIG. 1A) to be formed hereafter. In some embodiments, the first masking layer 504 is or comprises a photoresist and/or the first masking layer 504 is patterned using photolithography.

After the first masking layer 504 is patterned, a first etching process 502 is performed into the barrier layer 106 and the channel layer 104 with the first masking layer 504 in place. The first etching process 502 removes portions of the barrier layer 106 and portions of the channel layer 104 exposed by the first masking layer 504 and further forms a trench 506 in place of the removed portions. The trench 506 surrounds and demarcates an active region 103 of the channel layer 104 and the barrier layer 106. In some embodiments, the first etching process 502 is a dry etching process. The first masking layer 504 is then removed.

Figure 6:
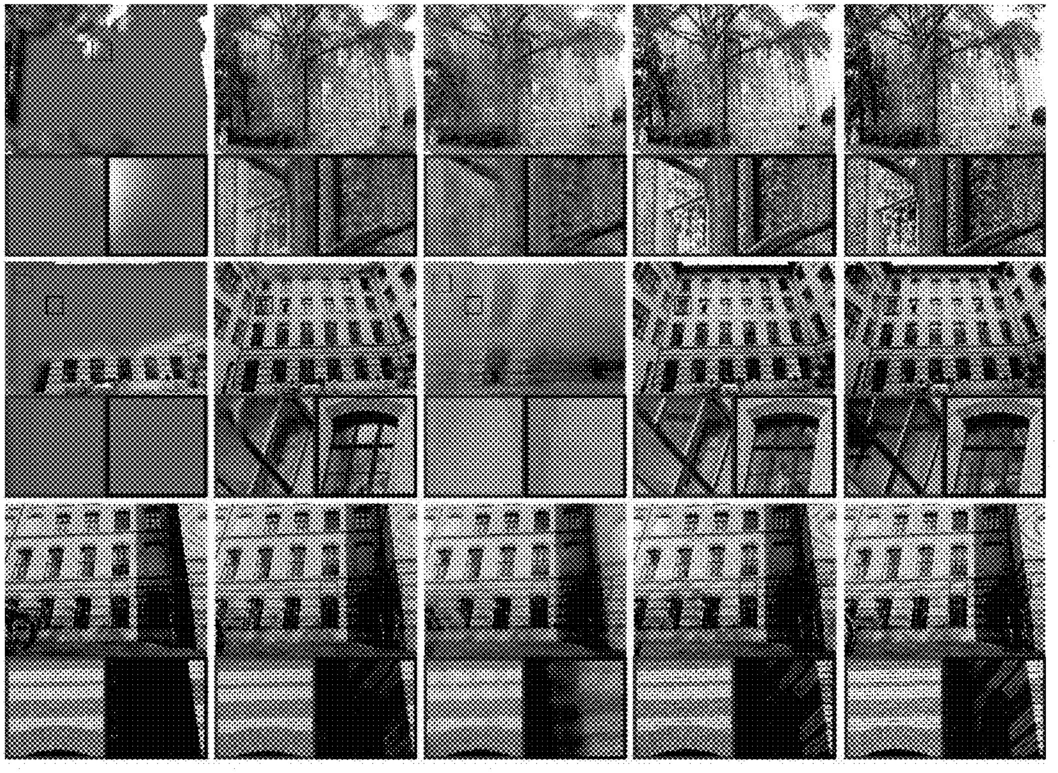

As shown in a top view 600*a* of FIG. 6A and cross-sectional views 600*b*, 600*c* of FIGS. 6B and 6C, an isolation structure 105 is formed in the trench 506. The isolation structure 105 may, for example, be formed from a dielectric by: 1) depositing the dielectric layer filling the trench 506 and covering the barrier layer 106; and 2) performing a planarization into the dielectric to remove the dielectric from atop the barrier layer 106. In some embodiments, the dielectric is deposited using one of CVD, PVD, ALD, sputtering, or the like. In some embodiments, the dielectric and hence the isolation structure 105 are or comprises an oxide (e.g., silicon oxide or the like). In some embodiments, the planarization is performed by a chemical mechanical planarization (CMP) process or the like.

Figure 7:
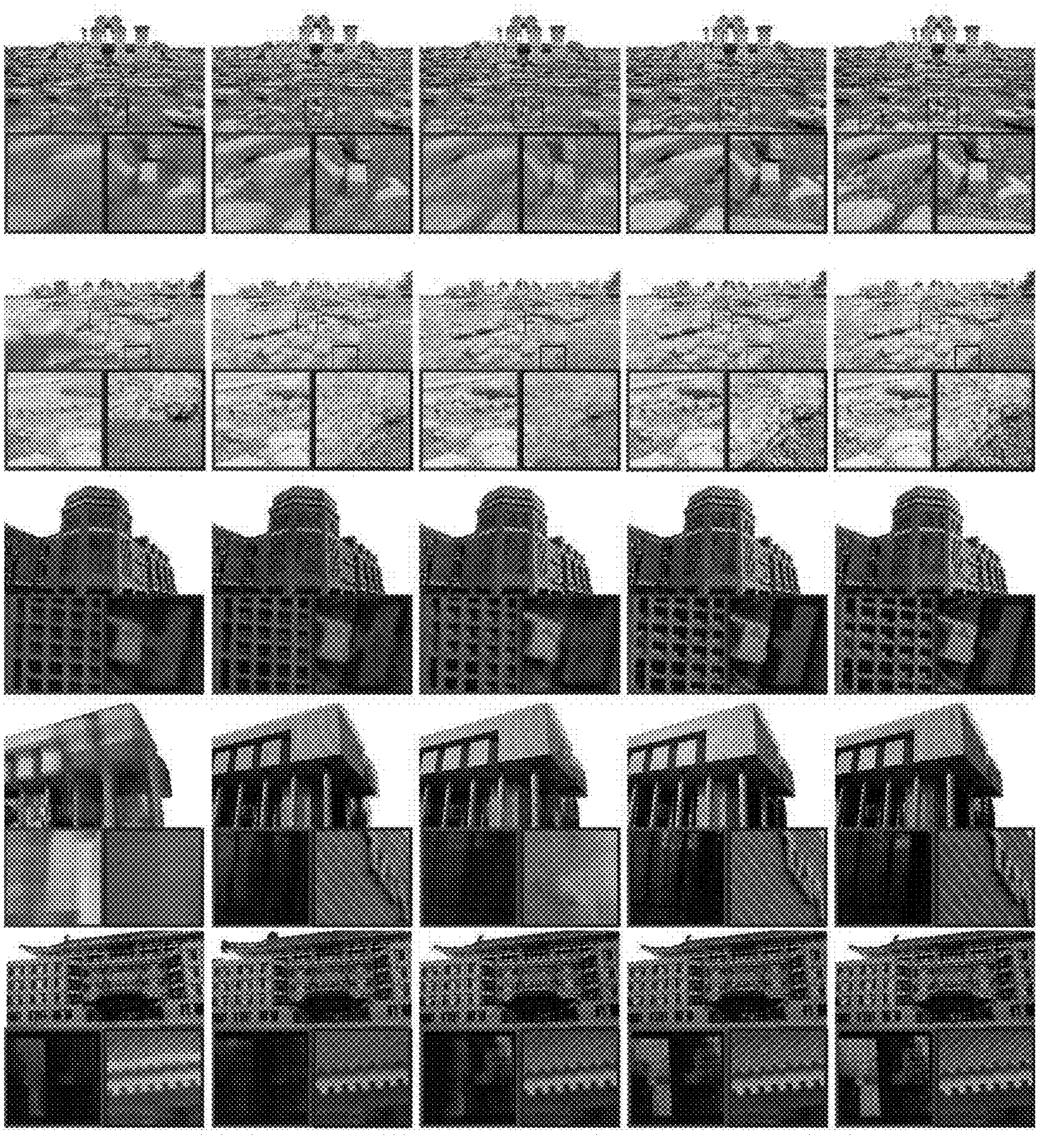

As shown in a top view 700*a* of FIG. 7A and cross-sectional views 700*b*, 700*c* of FIGS. 7B and 7C, a semiconductor layer 704 is deposited over the barrier layer 106 and the isolation structure 105. In some embodiments, the semiconductor layer 704 is or comprises gallium nitride (e.g., GaN) or the like. The semiconductor layer 704 may, for example, be deposited using MOCVD or the like. In some embodiments, the semiconductor layer 704 is doped. In such embodiments, the semiconductor layer 704 may be concurrently doped during deposition or may be doped after deposition by an implantation process 702. In some embodiments, the semiconductor layer 704 is deposited with p-type dopants, which may, for example, be or comprise magnesium (e.g., Mg) or the like.

Figure 8A:
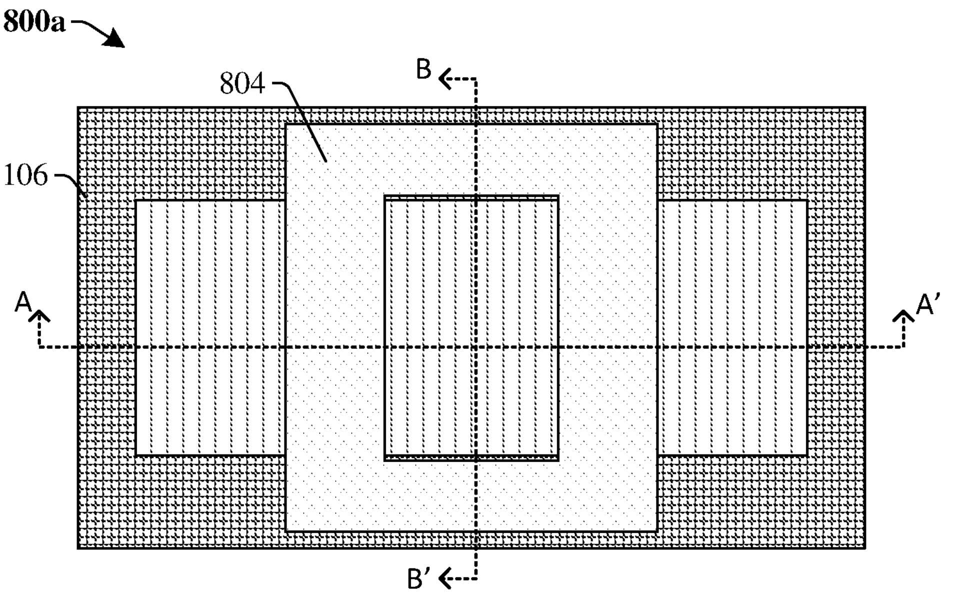
Figure 8B:
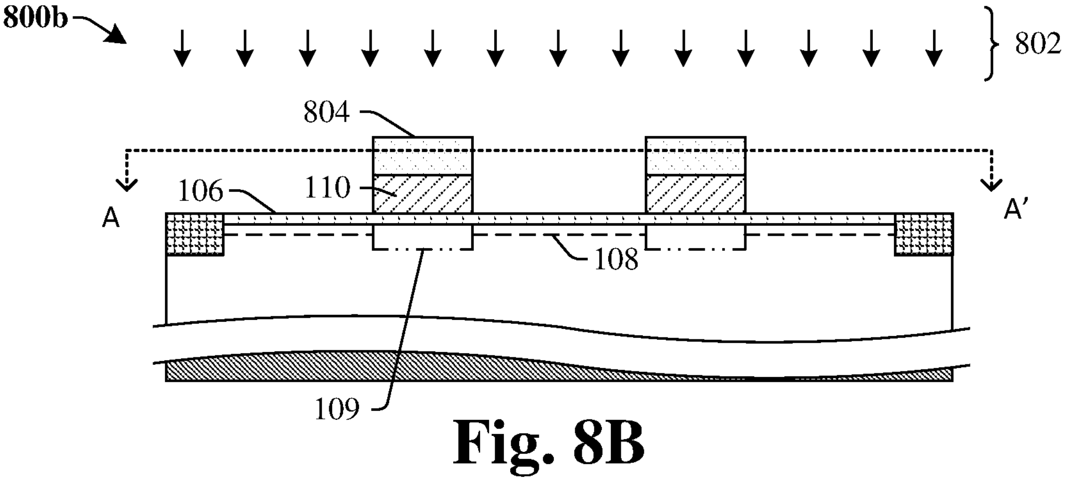
Figure 8C:
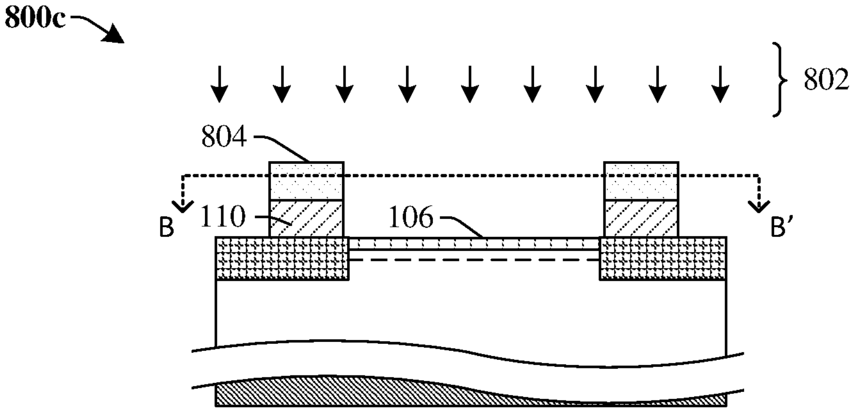

As shown in a the top view 800*a* of FIG. 8A and cross-sectional views 800*b*, 800*c* of FIGS. 8B and 8C, a second masking layer 804 is formed over the semiconductor layer (see, e.g., 704 of FIG. 7B). The second masking layer 804 may, for example, be formed using CVD, PVD, ALD, a spin-on process, or the like. The second masking layer 804 is then patterned, thereby exposing portions of the semiconductor layer corresponding to a semiconductor capping structure 110 being formed. In some embodiments, the second masking layer 804 is or comprises a photoresist and/or is patterned using photolithography.

After the second masking layer 804 is patterned, a second etching process 802 is performed into the semiconductor layer. The second etching process 802 removes portions of the semiconductor layer exposed by the second masking layer 804 to form the semiconductor capping structure 110. In some embodiments, the second etching process 802 is a dry etching process. The second masking layer 804 is then removed. The semiconductor capping structure 110 induces formation of a depletion region 109 in the channel 108. In some embodiments, before or after the semiconductor layer (see, e.g., 704 of FIG. 7B) is patterned, the semiconductor capping structure 110 may be doped with p-type doping.

Figure 9A:
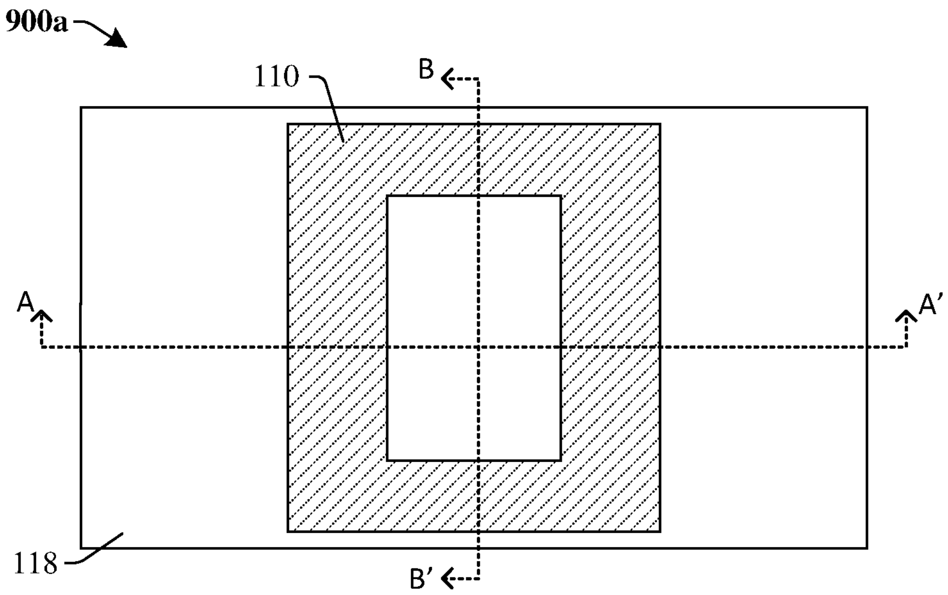
Figure 9B:
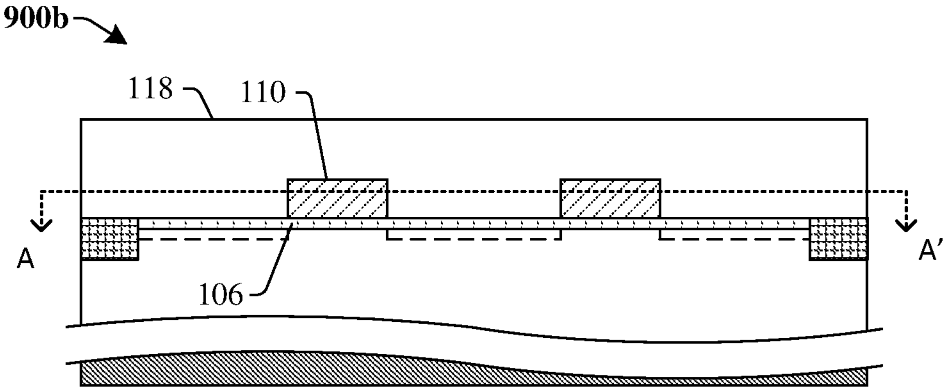
Figure 9C:
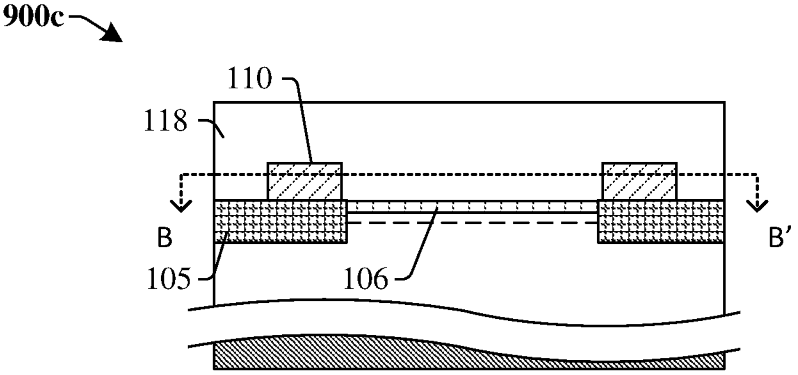

As shown in a top view 900*a* of FIG. 9A and cross-sectional views 900*b*, 900*c* of FIGS. 9B and 9C, a first dielectric 118 is deposited over the barrier layer 106, the isolation structure 105, and the semiconductor capping structure 110. In some embodiments, the first dielectric comprises an oxide (e.g., silicon oxide or the like). The first dielectric 118 is deposited using one of CVD, PVD, ALD, sputtering, or the like. In some embodiments, a planarization is further performed to flatten a top surface of the first dielectric 118. In some embodiments, the planarization is performed by a CMP process or the like.

Figure 10A:
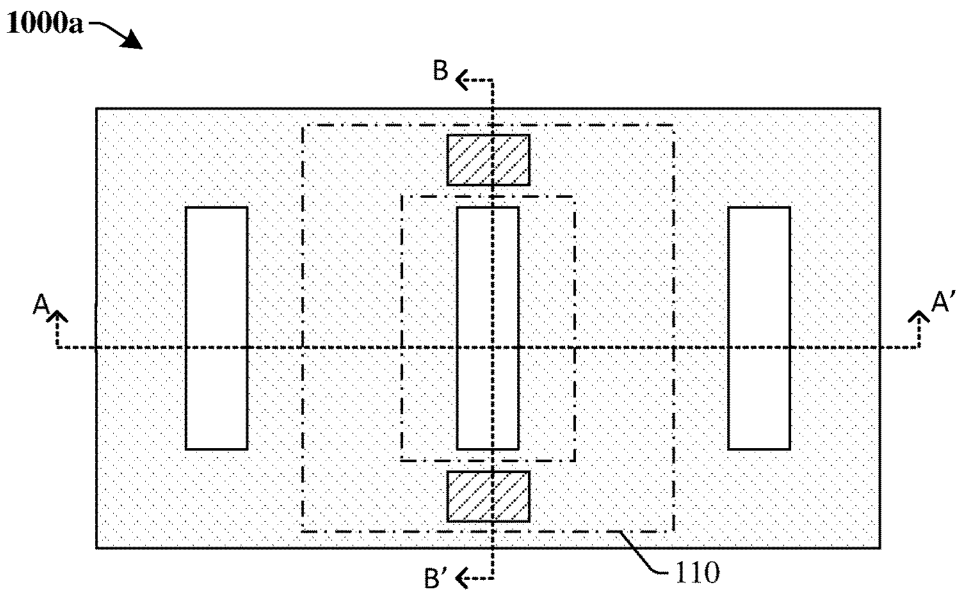
Figure 10B:
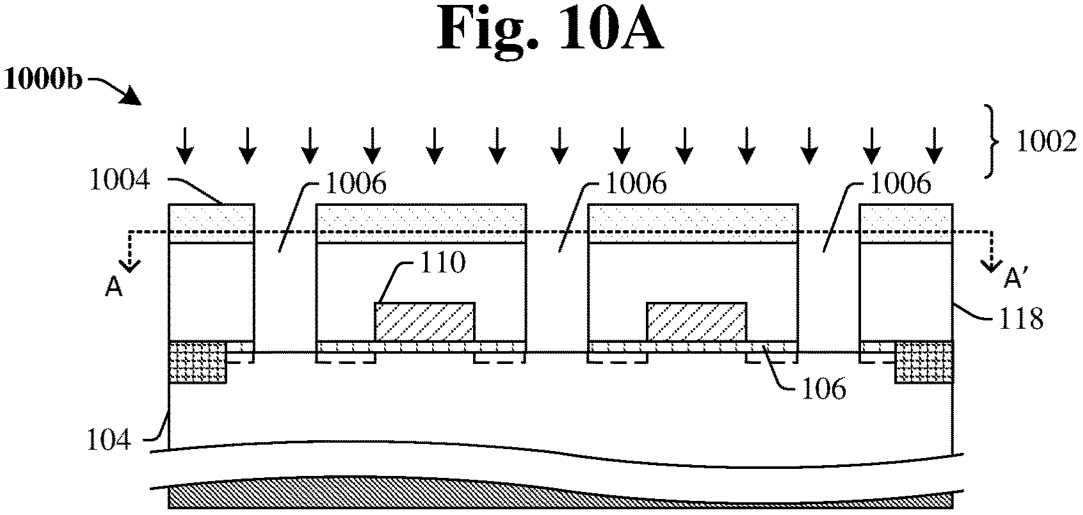
Figure 10C:
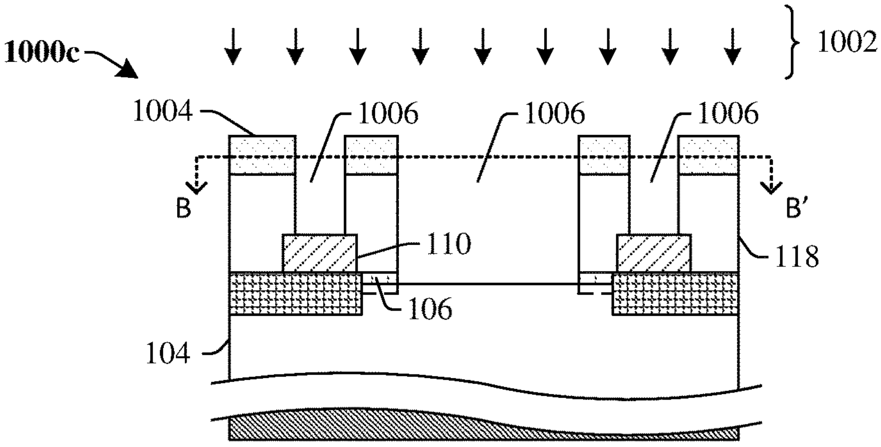

As shown in a top view 1000*a* of FIG. 10A and cross-sectional views 1000*b*, 1000*c* of FIGS. 10B and 10C, a third masking layer 1004 is formed over the first dielectric 118. The third masking layer 1004 is formed using CVD, PVD, ALD, a spin-on process, or the like. The third masking layer 1004 is then patterned, thereby exposing portions of the first dielectric 118 corresponding to positions of a first source/drain electrode 116*a*, a second source/drain electrode 116*b*, a third source/drain electrode 116*c*, a first helping gate 124*a*, and a second helping gate 124*b* being formed. In some embodiments, the third masking layer 1004 is or comprises a photoresist and/or is patterned using photolithography.

After the third masking layer 1004 is patterned, a third etching process 1002 is performed, thereby forming first openings 1006 in the portions of the first dielectric 118 exposed by the third masking layer 1004. In some embodiments, the third etching process 1002 is a dry etching process. In some embodiments, the third etching process 1002 is tuned to preferentially etch the material of the first dielectric 118 (e.g., silicon dioxide ($SiO_2$) or the like) relative to material of other structures and/or layers (e.g., the barrier layer 106, the isolation structure 105, etc.) underlying the first dielectric 118. This results in the first dielectric 118 being etched to different depths based on different bottom-surface depths of the first dielectric 118. For example, the first openings 1006 may reach a top surface of the semiconductor capping structure 110 and the top surface of the barrier layer 106 without etching through the semiconductor capping structure 110. The barrier layer 106 has a lesser thickness than the semiconductor capping structure 110. In some embodiments, the third etching process 1002 etches through the barrier layer 106 to expose the channel layer 104 without etching through the semiconductor capping structure 110. The third masking layer 1004 is then removed.

Figure 11A:
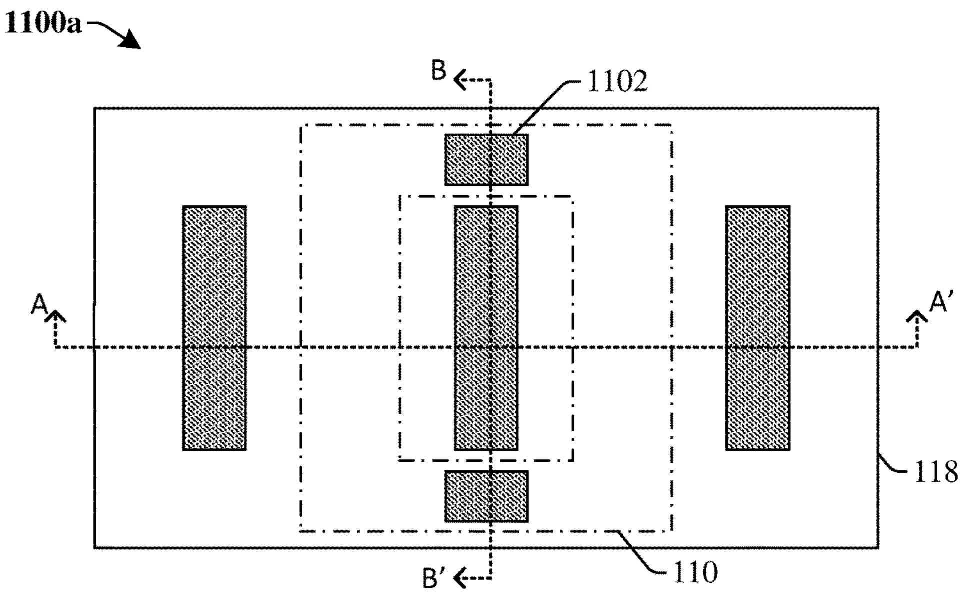
Figure 11B:
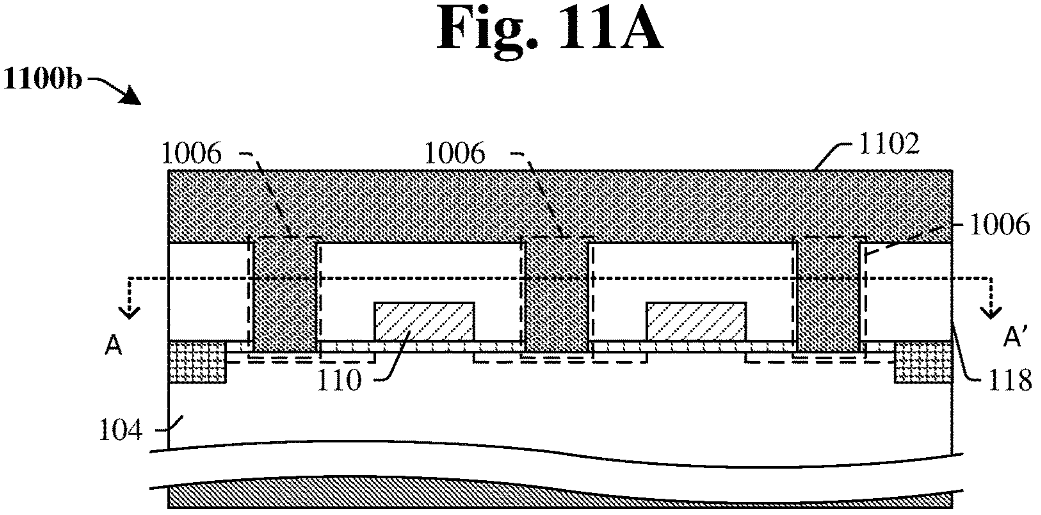
Figure 11C:
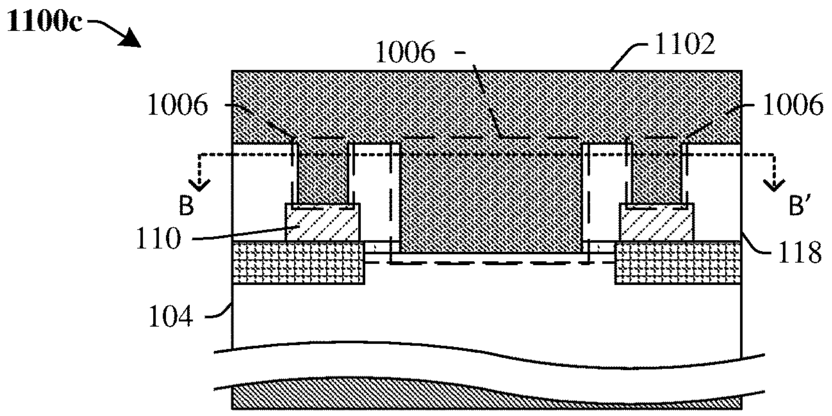

As shown in a top view 1100*a* of FIG. 11A and cross-sectional views 1100*b*, 1100*c* of FIGS. 11B and 11C, a conductive layer 1102 is deposited over the first dielectric 118 and in the first openings 1006. In some embodiments, the conductive layer 1102 comprises a metal, such as titanium (Ti) or the like. In some embodiments, the conductive layer 1102 is deposited using one of CVD, PVD, ALD, sputtering, electrochemical plating, electroless plating, some other suitable deposition process, or a combination of the foregoing.

Figure 12A:
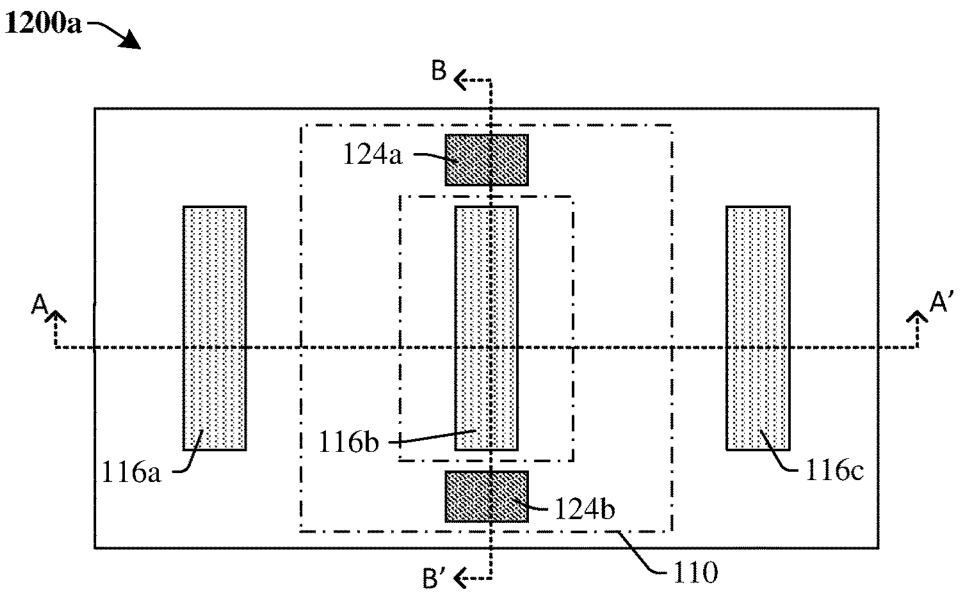
Figure 12B:
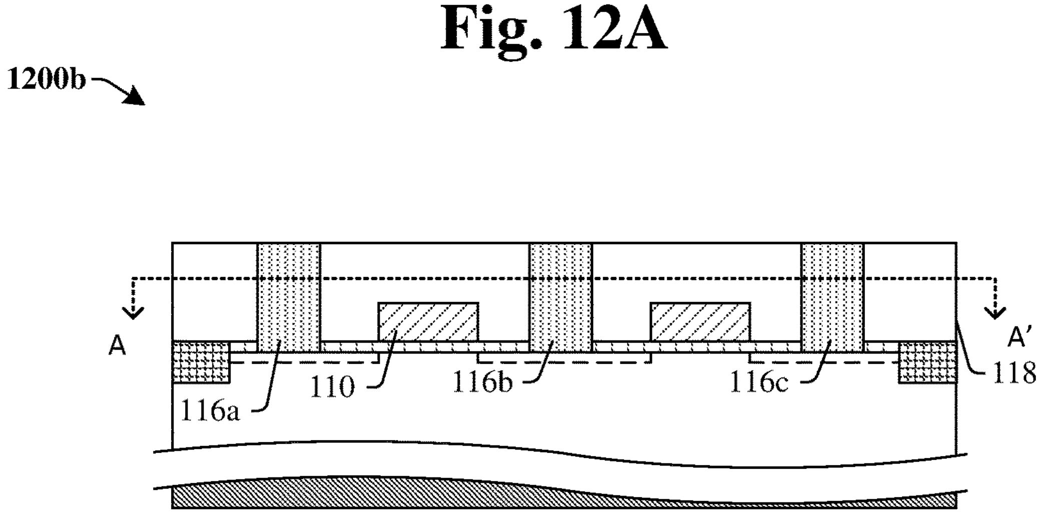
Figure 12C:
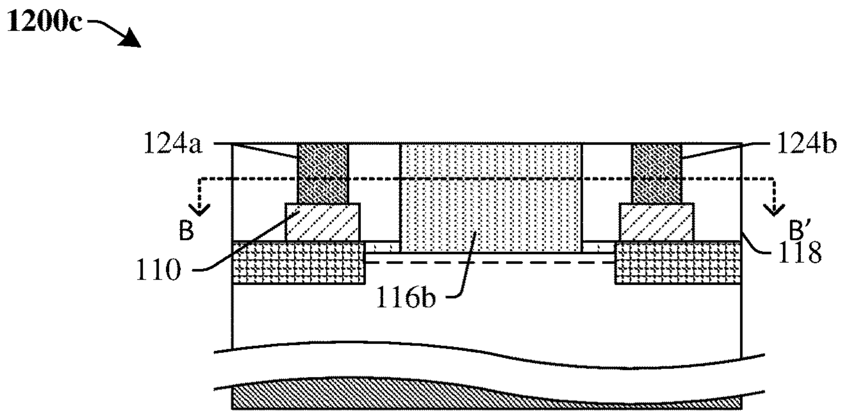

As shown in a top view 1200*a* of FIG. 12A and cross-sectional views 1200*b*, 1200*c* of FIGS. 12B and 12C, portions of the conductive layer 1102 above the first dielectric 118 are removed, thereby leaving the first source/drain electrode 116*a*, the second source/drain electrode 116*b*, the third source/drain electrode 116*c*, the first helping gate 124*a*, and the second helping gate 124*b*. In some embodiments, the portions of the conductive layer 1102 are removed using a planarization process (e.g., a CMP process or the like). Forming the first helping gate 124*a* in the same steps as forming the first source/drain electrode 116*a* results in no additional processing steps for the pair of HEMTs being formed.

Figure 13A:
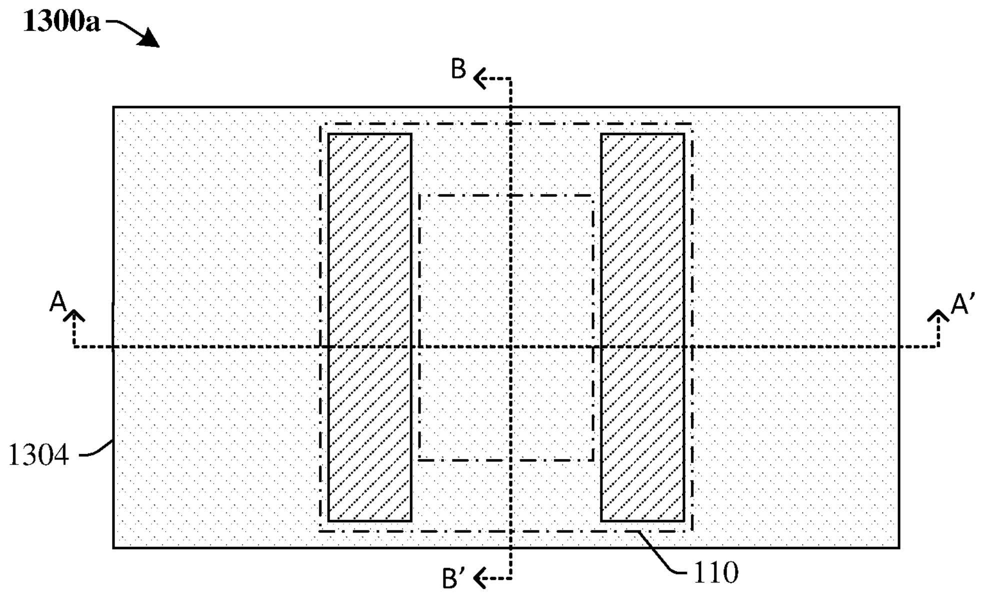
Figure 13B:
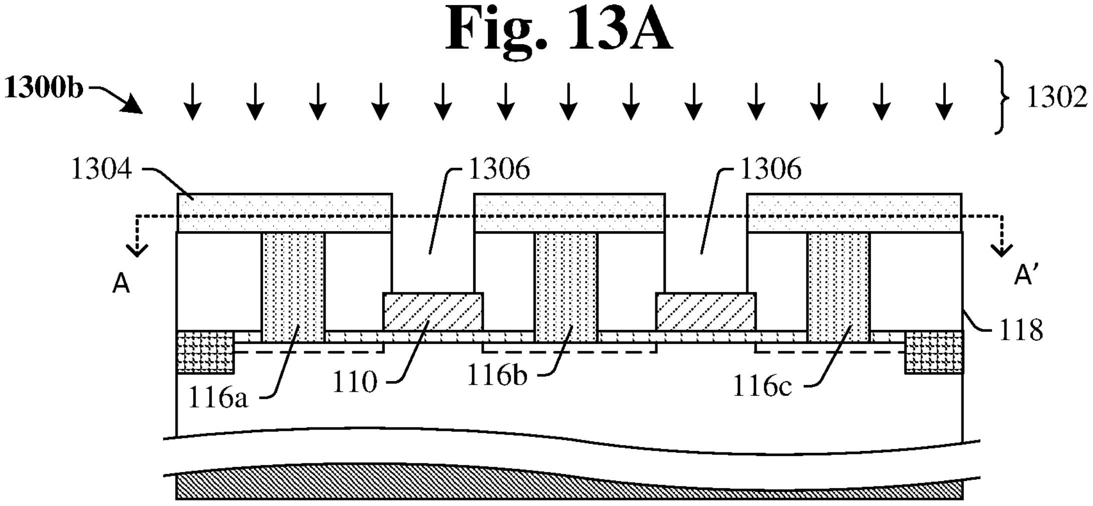
Figure 13C:
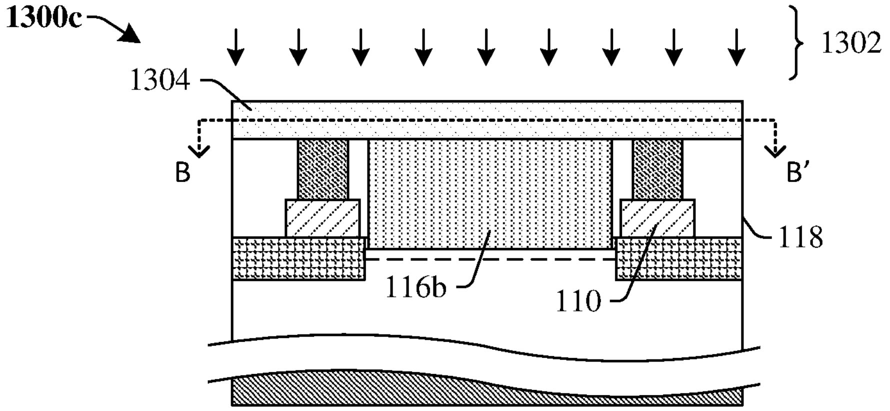

As shown in a top view 1300*a* of FIG. 13A and cross-sectional views 1300*b*, 1300*c* of FIGS. 13B and 13C, a fourth masking layer 1304 is formed over the first dielectric 118. The fourth masking layer 1304 is formed using CVD, PVD, ALD, a spin-on process, or the like. The fourth masking layer 1304 is then patterned, thereby exposing portions of the first dielectric 118 corresponding to a first gate 112*a*, a second gate 112*b*, and a gate dielectric 114 being formed. In some embodiments, the fourth masking layer 1304 is or comprises a photoresist and/or is patterned using photolithography.

After the fourth masking layer 1304 is patterned, a fourth etching process 1302 is performed into the first dielectric 118, thereby forming second openings 1306 in the first dielectric 118 exposed by the fourth masking layer 1304. In some embodiments, the fourth etching process 1302 is a dry etching process. The fourth masking layer 1304 is then removed.

Figure 14A:
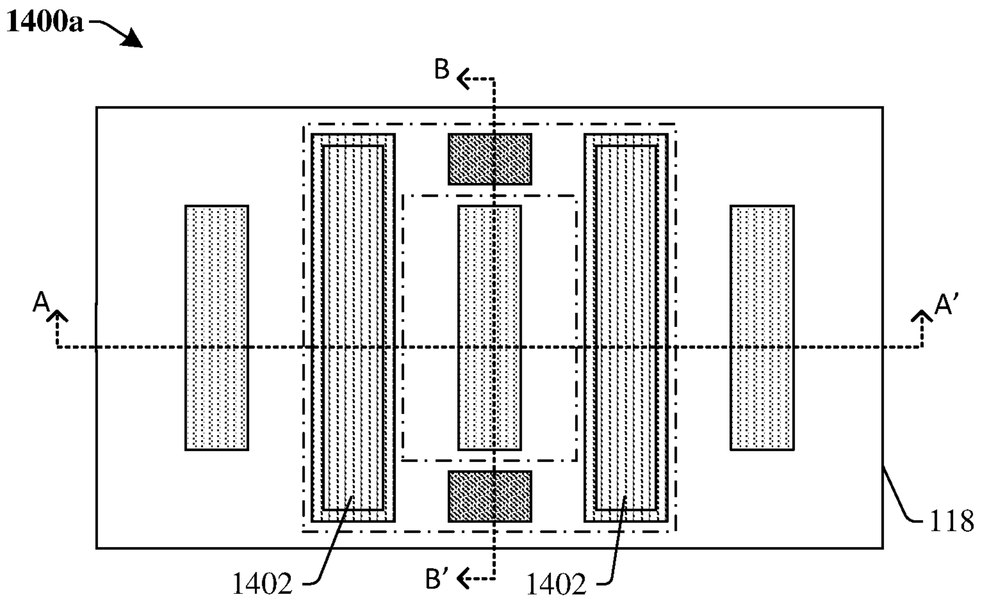
Figure 14B:
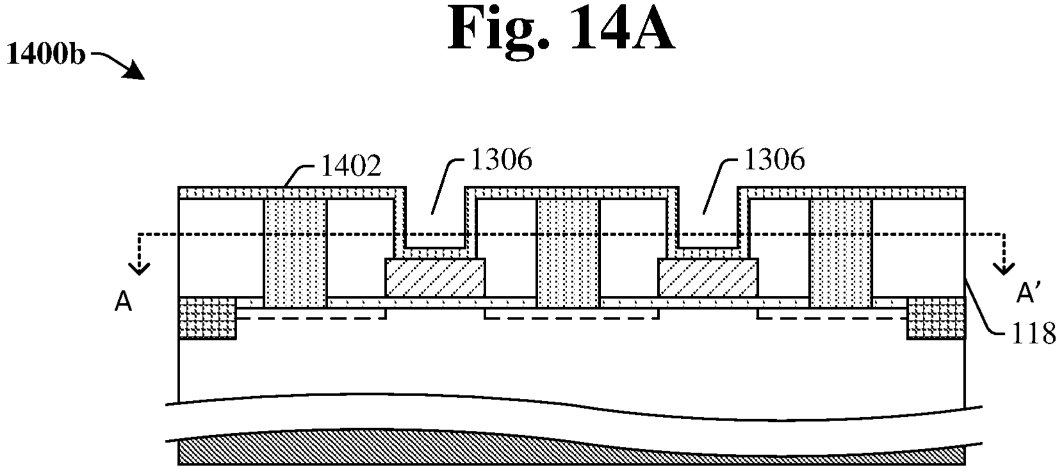
Figure 14C:
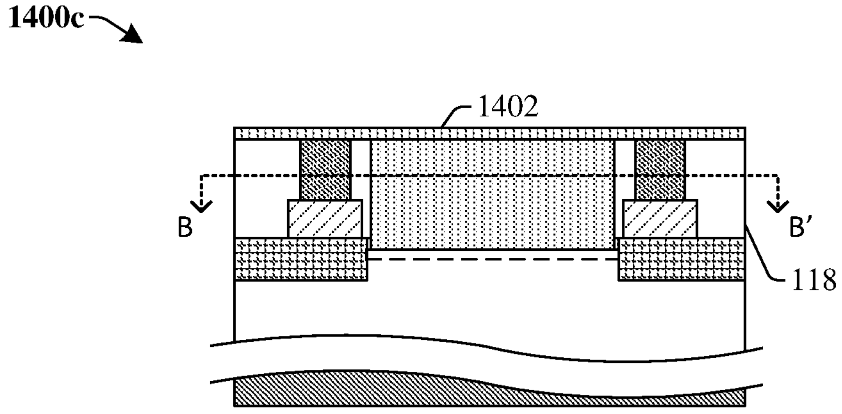

As shown in a top view 1400*a* of FIG. 14A and cross-sectional views 1400*b*, 1400*c* of FIGS. 14B and 14C, a conformal dielectric 1402 is deposited over the first dielectric 118 and in the second openings 1306. In some embodiments, the conformal dielectric 1402 is or comprises one of silicon dioxide (e.g., $SiO_2$), silicon nitride (e.g., $Si_3N_4$), silicon oxynitride (e.g., SiON), a combination of the foregoing, or the like. In some embodiments, the conformal dielectric 1402 is deposited using one of CVD, PVD, ALD, sputtering, some other suitable deposition process, or a combination of the foregoing.

Figure 15A:
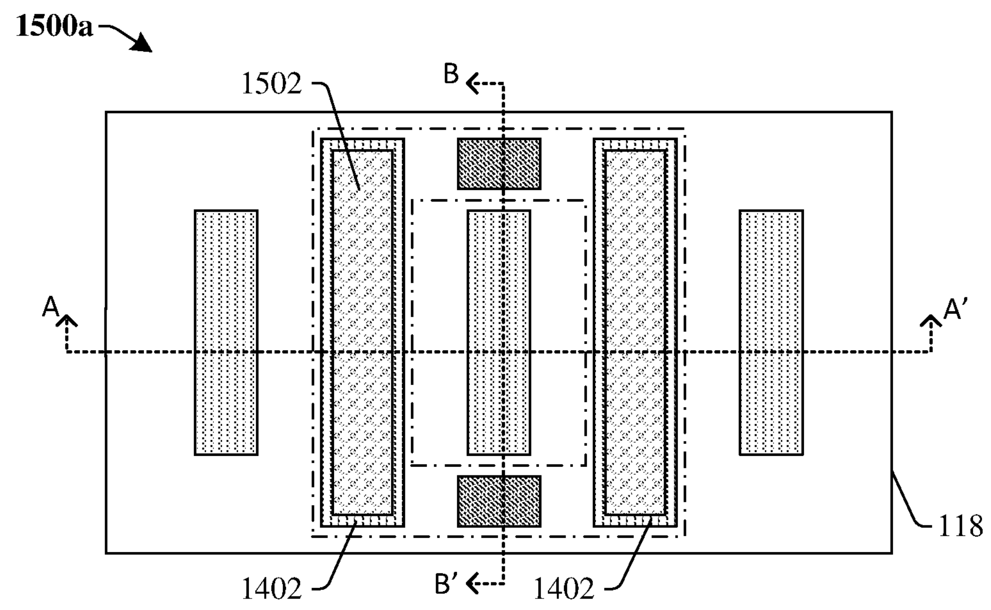
Figure 15B:
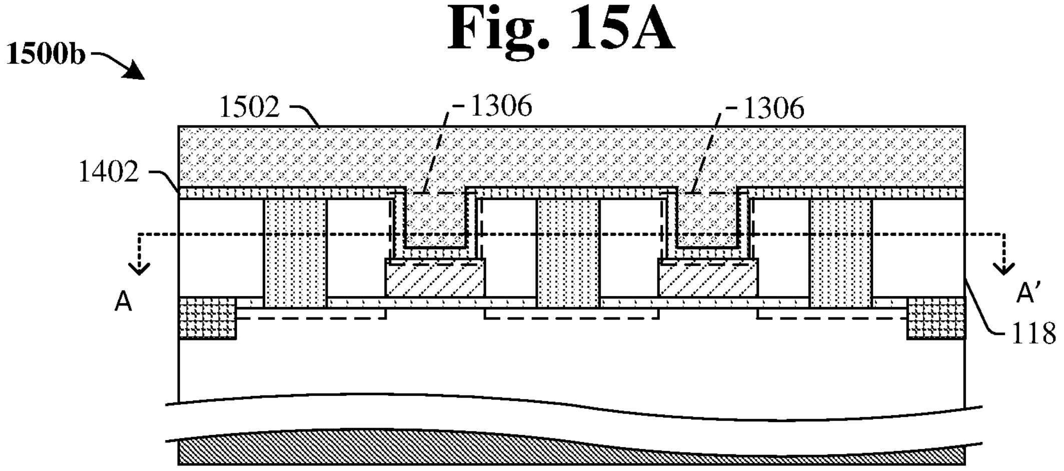
Figure 15C:
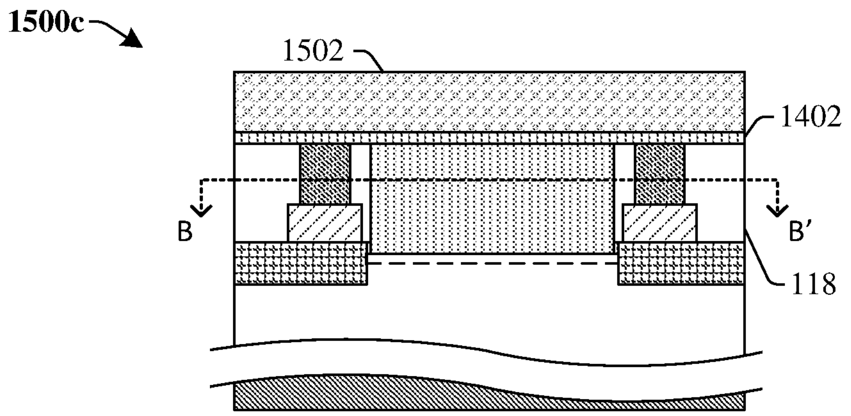

As shown in a top view 1500*a* of FIG. 15A and cross-sectional views 1500*b*, 1500*c* of FIGS. 15B and 15C, a second conductive layer 1502 is deposited over the conformal dielectric 1402 and in the second openings 1306 (shown in phantom). In some embodiments, the second conductive layer 1502 is or comprises titanium nitride (TiN) or the like. In some embodiments, the second conductive layer 1502 has a work function that is larger than a work function of the first helping gate 124*a* and the second helping gate 124*b*. The increased work function results in a greater difference between the work function of the second conductive layer 1502 and the electron affinity of the semiconductor capping structure 110, increasing a barrier between the materials. The increased work function further results in a greater difference between the work function of the second conductive layer 1502 and the electron affinity of the gate dielectric 114, resulting in a greater barrier when the gate dielectric 114 is present. In some embodiments, the second conductive layer 1502 is deposited using one of CVD, PVD, ALD, sputtering, some other suitable deposition process, or a combination of the foregoing.

Figure 16A:
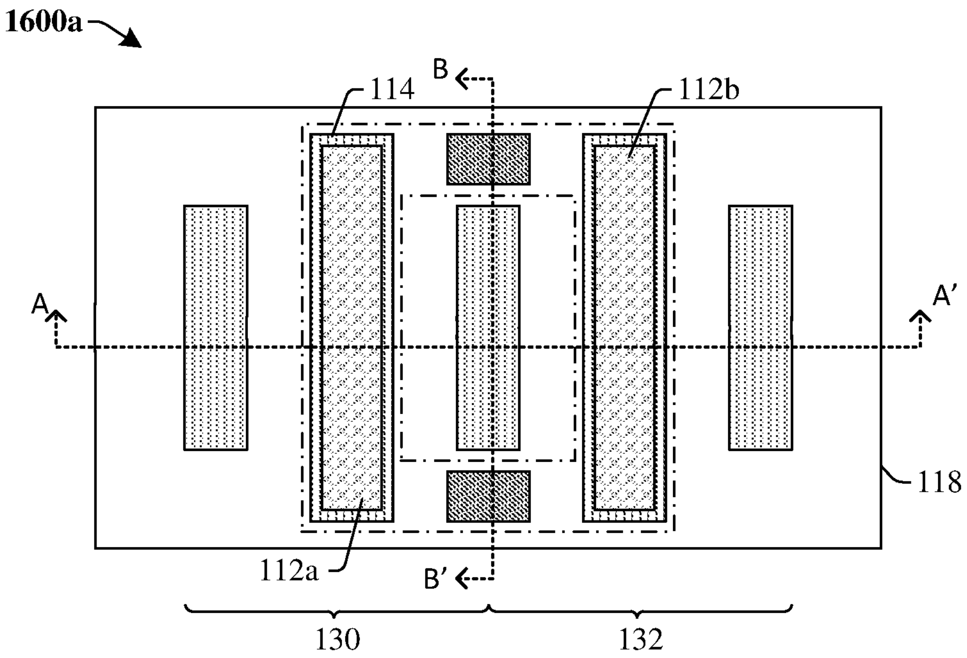
Figure 16B:
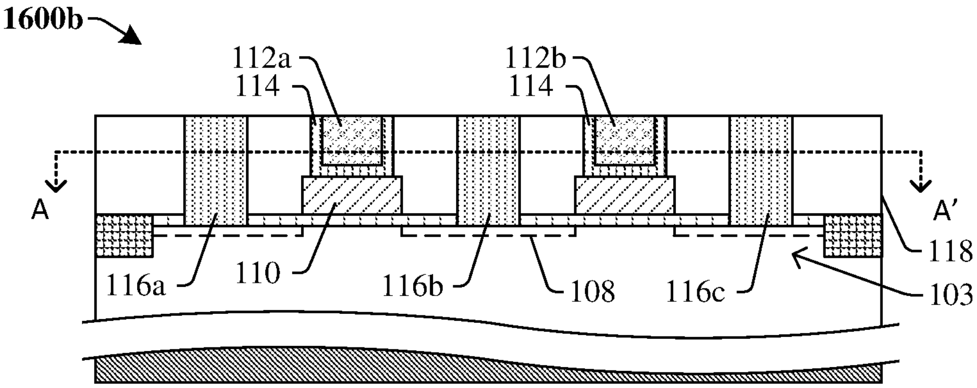
Figure 16C:
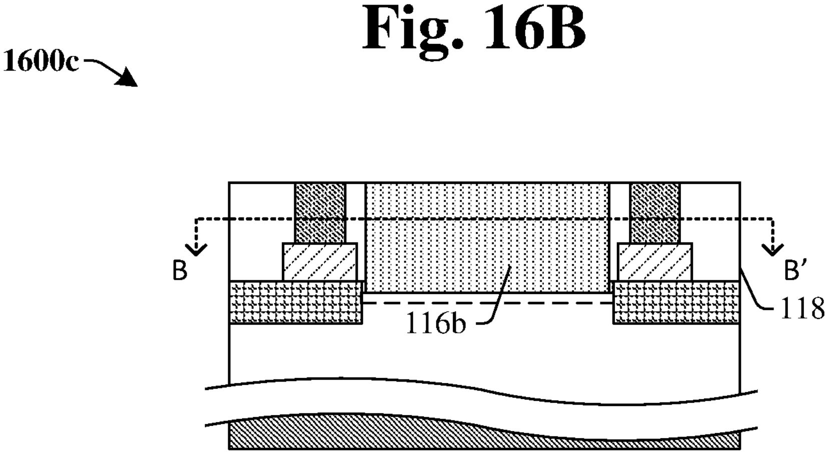

As shown in a top view 1600*a* of FIG. 16A and cross-sectional views 1600*b*, 1600*c* of FIGS. 16B and 16C, portions of the second conductive layer 1502 and the conformal dielectric 1402 above the first dielectric 118 are removed, thereby leaving the gate dielectric 114, the first gate 112*a*, and the second gate 112*b*. In some embodiments, the portions of the second conductive layer 1502 and the conformal dielectric 1402 are removed using a planarization process (e.g., a CMP process).

The first gate 112*a* and the second gate 112*b* are formed on opposite sides of the first helping gate 124*a*, such that the first helping gate 124*a* is between the first gate 112*a* and the second gate 112*b*. Similarly, the first gate 112*a* and the second gate 112*b* are formed on opposite sides of the second helping gate 124*b*, such that the second helping gate 124*b* is between the first gate 112*a* and the second gate 112*b*. Accordingly, inclusion of the first helping gate 124*a* and the second helping gate 124*b* does not increase the area of the pair of HEMTs being formed.

Together, the first gate 112*a*, the first source/drain electrode 116*a*, the second source/drain electrode 116*b*, and the channel 108 between the first source/drain electrode 116*a* and the second source/drain electrode 116*b* form a first HEMT 130. Further, the second gate 112*b*, the second source/drain electrode 116*b*, the third source/drain electrode 116*c*, and the channel 108 between the second source/drain electrode 116*b* and the third source/drain electrode 116*c* form a second HEMT 132. During operation of the first HEMT 130, the first helping gate 124*a* is biased to direct a leakage current into the semiconductor capping structure 110 and the active region 103. Similarly, during operation of the second HEMT 132, the second helping gate 124*b* is biased to direct a leakage current into the semiconductor capping structure 110 and the active region 103. Electrons may be trapped in the active region 103 and the semiconductor capping structure 110, resulting in variation of the threshold voltage when switching between states and an increase in ON resistance of the HEMT. The leakage current from the first helping gate 124*a* and the second helping gate 124*b* inject holes into the semiconductor capping structure 110, thereby removing electrons from traps within the semiconductor capping structure 110 and the active region 103, mitigating the number and effects of the trapped electrons.

Figure 17A:
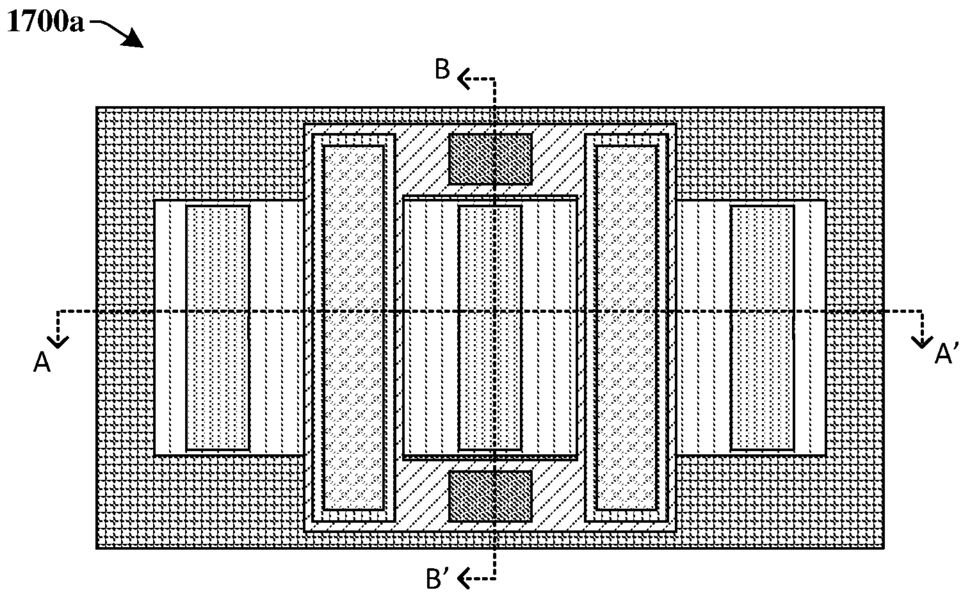
Figure 17B:
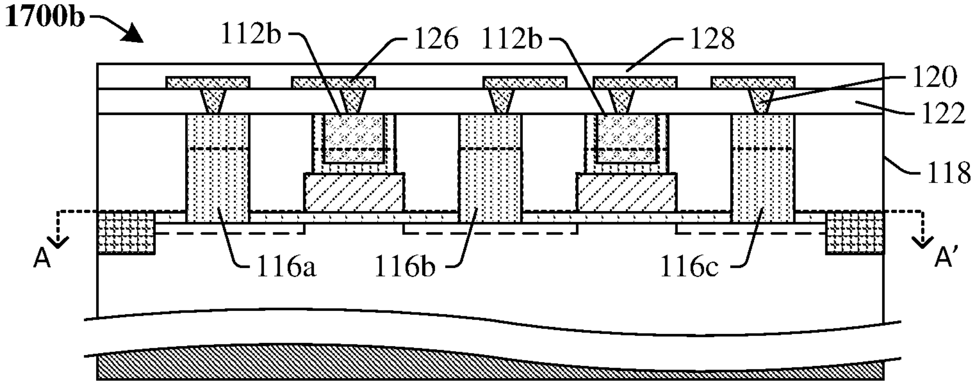
Figure 17C:
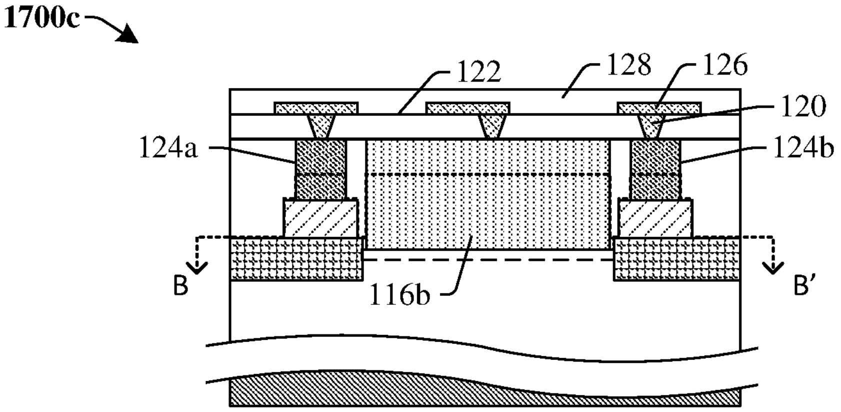

As shown in a top view 1700*a* of FIG. 17A and cross-sectional views 1700*b*, 1700*c* of FIGS. 17B and 17C, contacts 120 are formed in a second dielectric 122 that overlies the first dielectric 118. The contacts 120 are coupled to the first source/drain electrode 116*a*, the second source/drain electrode 116*b*, the third source/drain electrode 116*c*, the first gate 112*a*, the second gate 112*b*, the first helping gate 124*a*, and the second helping gate 124*b*. After the contacts 120 are formed, the interconnect structure 126 is formed in a third dielectric 128 that overlies the second dielectric 122. In some embodiments, the interconnect structure 126 couples the first gate 112*a* to the first helping gate 124*a* and the second gate 112*b* to the second helping gate 124*b*.

Figure 18:
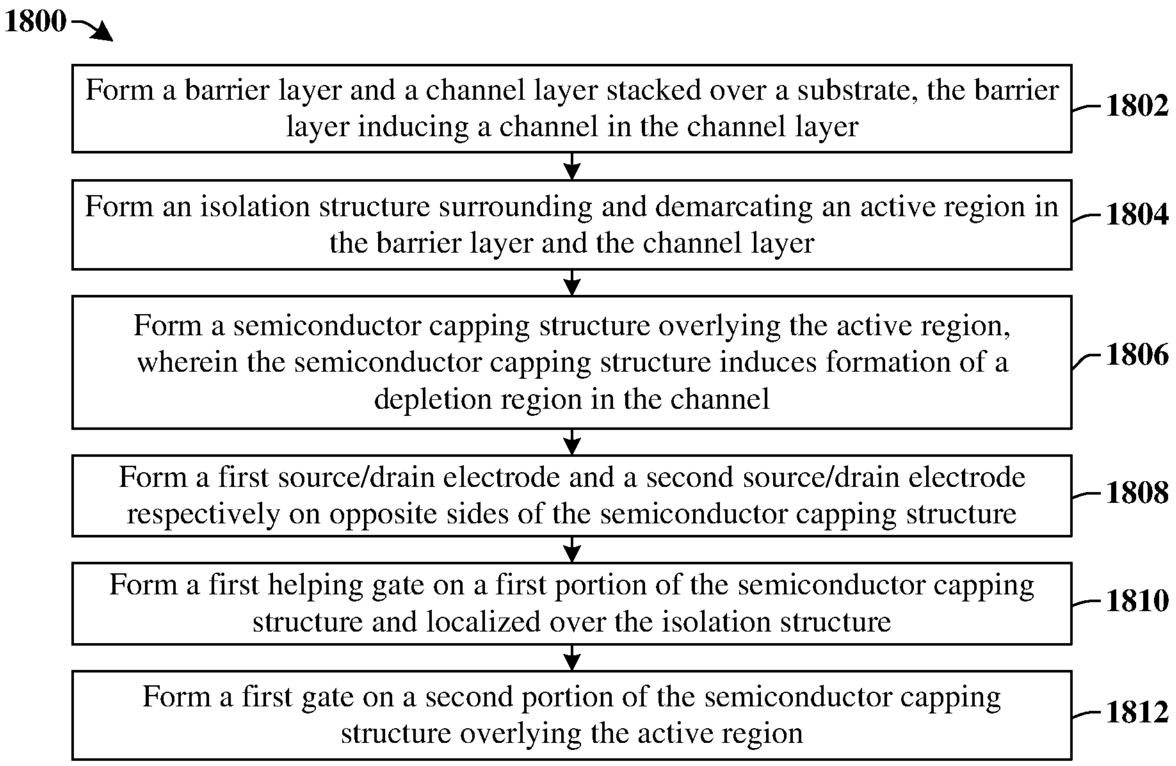
FIG. 18 illustrates a flowchart of some embodiments of a method of forming a HEMT with a helping gate.

FIG. 18 illustrates a methodology 1800 of forming an HEMT with a helping gate in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1802, a barrier layer and a channel layer are formed over a substrate, the barrier layer inducing a channel in the channel layer. See, for example, FIG. 4.

At 1804, an isolation structure is formed, surrounding and demarcating an active region in the barrier layer and the channel layer. See, for example, FIGS. 5-6.

At 1806, a semiconductor capping structure is formed overlying the active region, wherein the semiconductor capping structure induces formation of a depletion region in the channel. See, for example, FIGS. 7-8.

At 1808, a first source/drain electrode and a second source/drain electrode are formed respectively on opposite sides of the semiconductor capping structure. See, for example, FIG. 10-12.

At 1810, a first helping gate is formed on a first portion of the semiconductor capping structure and localized over the isolation structure. See, for example, FIG. 10-12.

At 1812, a first gate is formed on a second portion of the semiconductor capping structure overlying the active region. See, for example, FIG. 13-16.

Some embodiments relate to an integrated device, including a semiconductor film accommodating a two-dimensional carrier gas (2DCG) over a substrate; a first source/drain electrode over the semiconductor film; a second source/drain electrode over the semiconductor film; a semiconductor capping structure between the first source/drain electrode and the second source/drain electrode; a first gate overlying the semiconductor capping structure and between the first source/drain electrode and the second source/drain electrode in a first direction; a first helping gate overlying the semiconductor capping structure and bordering the first gate, wherein the first helping gate and the second source/drain electrode are arranged in a line extending in a second direction transverse to the first direction.

Other embodiments relate to an integrated device, comprising a group III-V heterojunction structure over a substrate; an isolation structure surrounding and demarcating an active region of the group III-V heterojunction structure; a first source/drain electrode, a second source/drain electrode, and a gate electrode overlying the active region with the gate electrode between the first and second source/drain electrodes; and a first helping gate overlying the isolation structure, bordering a first end of the second source/drain electrode and laterally offset from the active region.

Yet other embodiments relate to a method of forming an integrated device, including forming a barrier layer and a channel layer stacked over a substrate, the barrier layer inducing a channel in the channel layer; forming an isolation structure surrounding and demarcating an active region in the barrier layer and the channel layer; forming a semiconductor capping structure overlying the active region, wherein the semiconductor capping structure induces formation of a depletion region in the channel; forming a first source/drain electrode and a second source/drain electrode respectively on opposite sides of the semiconductor capping structure; forming a first helping gate on a first portion of the semiconductor capping structure and localized over the isolation structure; forming a first gate on a second portion of the semiconductor capping structure overlying the active region.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated device, comprising:

forming a barrier layer and a channel layer stacked over a substrate, the barrier layer inducing a channel in the channel layer;

forming an isolation structure surrounding and demarcating an active region in the barrier layer and the channel layer;

forming a semiconductor capping structure overlying the active region, wherein the semiconductor capping structure induces formation of a depletion region in the channel;

forming a first source/drain electrode and a second source/drain electrode respectively on opposite sides of the semiconductor capping structure;

forming a first helping gate on a first portion of the semiconductor capping structure and localized over the isolation structure, wherein the first helping gate is formed by depositing a conductive layer and performing a planarization step on the conductive layer to concurrently form the first source/drain electrode, the second source/drain electrode, and the first helping gate; and forming a first gate on a second portion of the semiconductor capping structure overlying the active region.

2. The method of claim 1, further comprising forming a gate dielectric after concurrently forming the first source/drain electrode, the second source/drain electrode, and the first helping gate and before forming the first gate.

3. The method of claim 1, further comprising:

depositing a dielectric over the semiconductor capping structure;

patterning the dielectric to form a plurality of openings;

depositing the conductive layer, thereby filling the openings and covering the dielectric; and performing a the planarization step on the conductive layer to concurrently form the first source/drain electrode, the second source/drain electrode, and the first helping gate in the plurality of openings.

4. The method of claim 3, wherein the plurality of openings comprise a first opening corresponding to the first helping gate, and further comprise a second opening and a third opening corresponding to the first source/drain electrode and the second source/drain electrode, and wherein the first opening has a lesser depth than the second opening and the third opening.

5. The method of claim 1, further comprising:

forming a second helping gate while forming the first helping gate, where the second helping gate is formed on a third portion of the semiconductor capping structure over the isolation structure, and where the first portion and the third portion are separated by the active region.

6. The method of claim 1, further comprising:

depositing a dielectric over the semiconductor capping structure;

patterning the dielectric to form an opening exposing the semiconductor capping structure after forming the first helping gate;

depositing a gate dielectric lining the opening; and forming the gate overlying the gate dielectric in the opening, wherein the first helping gate is formed directly on the semiconductor capping structure.

7. A method of forming an integrated device, comprising:
forming a channel layer over a substrate;
forming a barrier layer over the channel layer;
removing portions of the barrier layer and the channel layer surrounding a first region of the channel layer, thereby forming a trench within the channel layer surrounding the first region;
filling the trench with an insulative material;
forming a semiconductor layer over the first region and the insulative material;
patterning the semiconductor layer into a semiconductor capping structure with a ring shape from a top-down perspective, wherein the ring shape has a first opening;
forming a first source/drain electrode within the first opening of the ring shape and on the first region;
forming a second source/drain electrode outside of the ring shape and on the first region;
forming a first helping gate on the semiconductor capping structure and localized over a first portion of the ring shape that overlies the insulative material; and
forming a first gate on the semiconductor capping structure and localized over a second portion of the ring shape that overlies the first region.

8. The method of claim 7, further comprising forming a first gate dielectric over the second portion of the ring shape before forming the first gate.

9. The method of claim 8, wherein the first gate dielectric is formed after forming the first helping gate.

10. The method of claim 8, further comprising forming a first dielectric before forming the first helping gate, wherein after the first gate dielectric and the first gate are formed, the first gate dielectric is spaced from the first helping gate by the first dielectric.

11. The method of claim 7, wherein after the portions of the channel layer are removed, an upper surface of the channel layer underlies the trench.

12. The method of claim 7, wherein the first source/drain electrode and the second source/drain electrode extend beneath the semiconductor capping structure.

13. The method of claim 7, wherein the semiconductor capping structure is electrically coupled to the first helping gate and is electrically insulated from the first gate.

14. A method of forming an integrated device, comprising:
forming a heterojunction structure over a substrate;
forming an isolation structure around a first region of the heterojunction structure;
forming a semiconductor capping layer over the heterojunction structure, wherein the semiconductor capping layer comprises a first portion overlying the heterojunction structure and a second portion overlying the isolation structure;
forming a first source/drain electrode on a first side of the semiconductor capping layer;
forming a second source/drain electrode on a second side of the semiconductor capping layer, wherein the second source/drain electrode is separated from the first source/drain electrode in a first direction by the semiconductor capping layer;
forming a first helping gate on the second portion of the semiconductor capping structure, wherein the first helping gate is spaced from the first region in a second direction transverse to the first direction;
forming a first gate dielectric over the semiconductor capping layer after forming the first helping gate; and
forming a first gate on the first portion of the semiconductor capping structure and between the first source/drain electrode and the second source/drain electrode, wherein the first gate is formed after forming the first gate dielectric, wherein the first gate is separated from the first helping gate in the first direction and the second direction, and wherein the first gate is separated from the semiconductor capping structure by the first gate dielectric.

15. The method of claim 14, wherein the first portion of the semiconductor capping layer comprises a first segment having a length extending from a first side to a second side of the first region in the second direction, and wherein the second portion of the semiconductor capping layer comprises a second segment having a length extending over the isolation structure and alongside the second side of the first region in the first direction.

16. The method of claim 14, wherein the semiconductor capping layer further comprises a third portion overlying the isolation structure and spaced from the first portion by the first region, and further comprising:
forming a second helping gate concurrent with forming the first helping gate, wherein the second helping gate is on the third portion of the semiconductor capping layer and is spaced from the first gate in the first direction and the second direction.

17. The method of claim 14, wherein the first source/drain electrode is coupled to the heterojunction structure and extends beneath the semiconductor capping layer.

18. The method of claim 14, wherein forming the heterojunction structure further comprises:
forming a channel layer over the substrate; and
forming a barrier layer over the channel layer.

19. The method of claim 18, wherein the channel layer is gallium nitride and wherein the barrier layer is aluminum gallium nitride.

20. The method of claim 18, wherein the isolation structure surrounds the heterojunction structure in the first direction and the second direction, and wherein the first gate extends from a first segment of the isolation structure to a second segment of the isolation structure in the second direction across the heterojunction structure.

* * * * *